(12) United States Patent
Osugi

(10) Patent No.: US 8,922,015 B2
(45) Date of Patent: Dec. 30, 2014

(54) SEMICONDUCTOR DEVICE

(71) Applicant: Renesas Electronics Corporation, Kawasaki-shi, Kanagawa (JP)

(72) Inventor: Eiji Osugi, Yanai (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/857,247

(22) Filed: Apr. 5, 2013

(65) Prior Publication Data

US 2013/0264710 A1    Oct. 10, 2013

(30) Foreign Application Priority Data

Apr. 5, 2012    (JP) .................... 2012-086410

(51) Int. Cl.
*H01L 23/48* (2006.01)
*H01L 27/08* (2006.01)
*H01L 23/00* (2006.01)

(52) U.S. Cl.
CPC ............ *H01L 27/0814* (2013.01); *H01L 24/45* (2013.01); *H01L 24/97* (2013.01); *H01L 2224/32245* (2013.01); *H01L 2224/48247* (2013.01); *H01L 2224/49113* (2013.01); *H01L 2224/73265* (2013.01); *H01L 2924/19107* (2013.01); *H01L 2224/97* (2013.01); *H01L 2224/45144* (2013.01)
USPC ............................ 257/741; 257/620; 257/734

(58) Field of Classification Search
CPC .......... H01L 24/32; H01L 24/45; H01L 24/97
USPC ......................................... 257/620, 741, 734
See application file for complete search history.

(56) References Cited

U.S. PATENT DOCUMENTS 7,489,488 B2    2/2009  Vos et al.
2013/0228930 A1*  9/2013  Ono et al. ................. 257/762

FOREIGN PATENT DOCUMENTS

| JP | 1-129450 A | 5/1989 |
| JP | 11-312781 A | 11/1999 |
| JP | 2004-126622 | * 4/2004 |
| JP | 2009-515323 T | 4/2009 |

* cited by examiner

*Primary Examiner* — A. Sefer
(74) *Attorney, Agent, or Firm* — Miles & Stockbridge P.C.

(57) ABSTRACT

Provided is a semiconductor device characterized by that first to fourth semiconductor chips are mounted on first to fourth electrodes formed by plating, respectively; the surface of the first semiconductor chip and the upper surface of a fifth electrode, the surface of the second semiconductor chip and the upper surface of the first electrode, the surface of the third semiconductor chip and the upper surface of the fourth electrode, the surface of the fourth semiconductor chip and the upper surface of the fifth electrode, and the upper surface of the second electrode and the upper surface of the third electrode are coupled to each other by first to fifth conductive members, respectively; and the back surfaces of the first to fifth electrodes are exposed from a resin molding. The invention makes it possible to reduce the size and the thickness of a semiconductor device configuring a diode bridge circuit.

23 Claims, 29 Drawing Sheets

FIG. 6
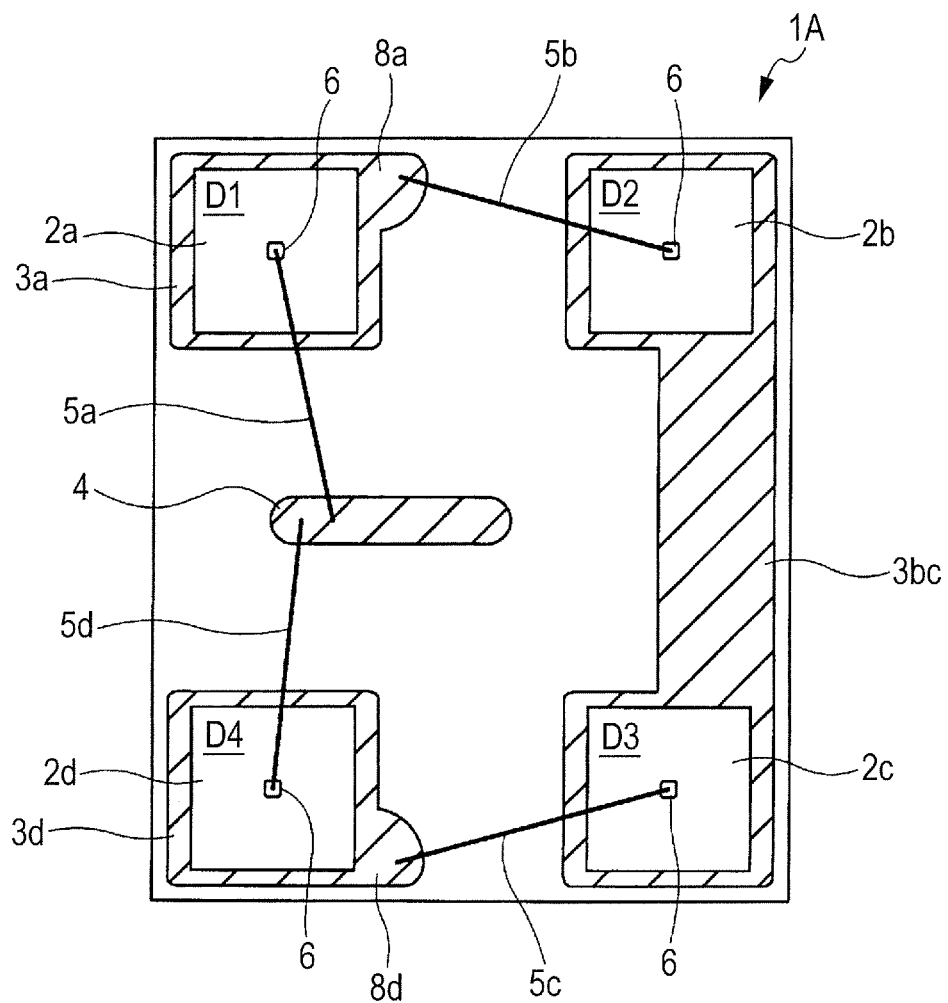
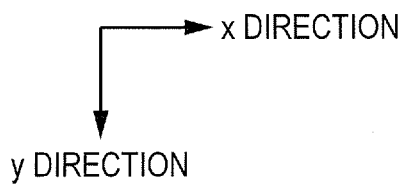

FIG. 7
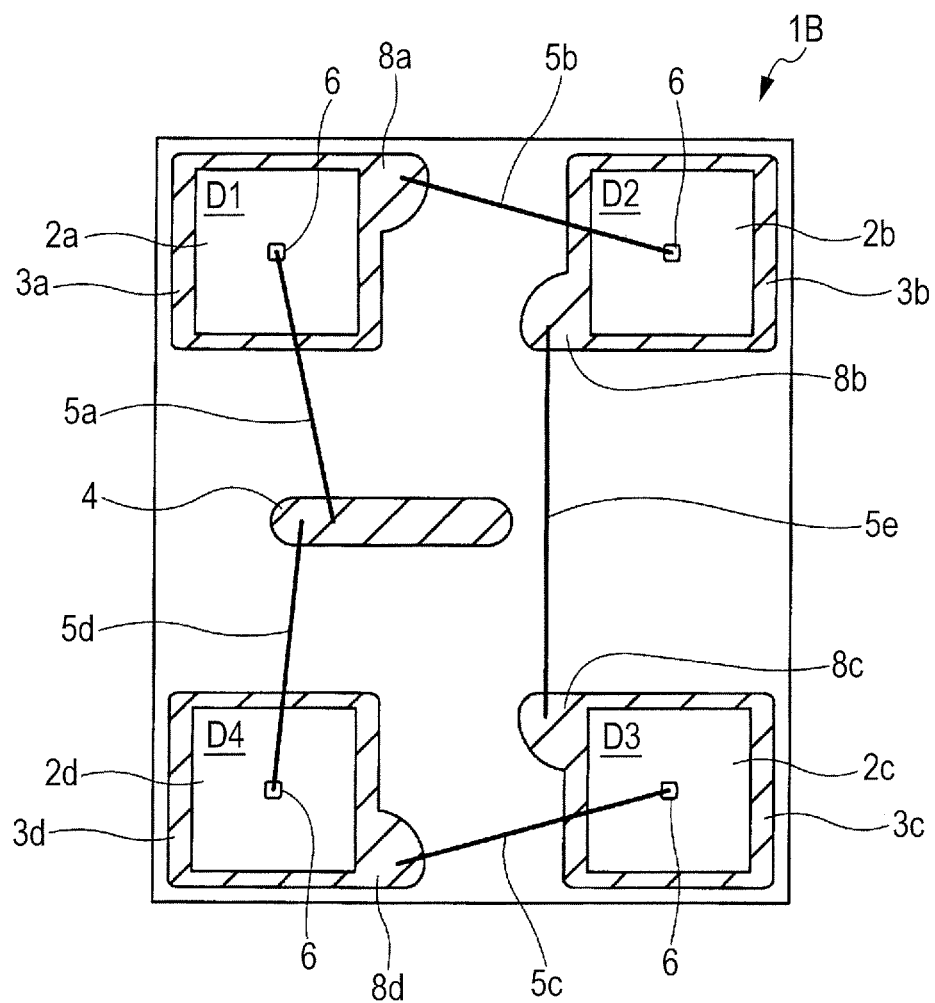
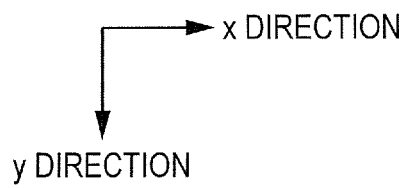

SEMICONDUCTOR DEVICE

CROSS-REFERENCE TO RELATED APPLICATIONS

The disclosure of Japanese Patent Application No. 2012-086410 filed on Apr. 5, 2012 including the specification, drawings and abstract is incorporated herein by reference in its entirety.

BACKGROUND

The present invention relates to a semiconductor device, in particular, to a technology effective when applied to a semiconductor device configuring a diode bridge circuit.

For example, Japanese Patent Laid-Open No. Hei 1 (1989)-129450 (Patent Document 1) discloses a method of manufacturing a semiconductor device configuring a diode bridge circuit. This method can prevent occurrence of wrong polarity by supplying/mounting and fixing diode chips onto the lead portion of a leadframe so that all the chips have the same polarity.

Japanese Patent Laid-Open No. Hei 11 (1999)-312781 (Patent Document 2) discloses a method of manufacturing a bridge-type semiconductor device by using a first leadframe and a second leadframe in which a plurality of metal plate units equipped with a die pad portion and a terminal portion integrated therewith has been connected in the X and Y directions, sandwiching a semiconductor chip between the die pads of these lead frames and then soldering them.

International Patent Publication No. 2009-515323 (Patent Document 3) discloses an overvoltage protection circuit integrated in a semiconductor chip and includes a diode bridge, a transient voltage suppressor device, and a resistor.

PATENT DOCUMENTS

[Patent Document 1] Japanese Patent Laid-Open No. Hei 1 (1989)-129450/1989
[Patent Document 2] Japanese Patent Laid-Open No. Hei 11 (1999)-312781
[Patent Document 3] International Patent Publication No. 2009-515323

SUMMARY

A diode bridge circuit, one of rectifier circuits, is usually formed by connecting four diodes, which are each an independent part.

Each diode is comprised of, for example, a pair of leads placed opposite to each other, a semiconductor chip mounted on the upper surface of one of the leads, a wire for electrically coupling this semiconductor chip and the other lead, and a molding which covers the semiconductor chip and the wire therewith while exposing a portion of each of the leads. The leads are made of a portion of a leadframe formed by patterning a conductive substrate.

As a result of investigation on a diode having the above-mentioned structure, the present inventors succeeded in the formation of a diode having a longitudinal size of 2.5 mm, a lateral size of 1.25 mm, a height size of 0.55 mm and also succeeded in the formation of a semiconductor device configuring a diode bridge circuit having a minimum area of 12.5 $mm^2$ when viewed from the top and a thickness of 0.5 mm by connecting four diodes each having the above size.

With a reduction in the size and thickness of electronic devices such as portable devices, however, there is an increasing demand for further size and thickness reduction of even a semiconductor device configuring a diode bridge circuit. Although the further size and thickness reduction of a semiconductor device configuring a diode bridge circuit can be accomplished by decreasing the size of the diode having the above-mentioned structure, it makes the processing technology difficult and may presumably cause deterioration in reliability.

With a view to reducing the size and thickness of a semiconductor device configuring a diode bridge circuit, the invention therefore discloses a semiconductor device configuring a diode bridge circuit in which a plurality of external terminals have been formed by electroplating using a base material made of a metal as a mother substrate and four semiconductor chips have been integrated in one semiconductor package by using the external terminals.

An object of the invention is to provide a technology capable of reducing the size and thickness of a semiconductor device configuring a diode bridge circuit.

The above-mentioned and other objects and novel features of the invention will be apparent from the description herein and accompanying drawings.

Among the inventions disclosed herein, one mode of the typical invention will next be described briefly.

In one mode, there is provided a semiconductor device sealed with a resin molding. It has a first electrode, a second electrode spaced apart from the first electrode in a first direction, a fourth electrode spaced apart from the first electrode in a second direction orthogonal to the first direction, and a third electrode spaced apart from the fourth electrode in the first direction. It also has a fifth electrode spaced apart from each of the first electrode, the second electrode, the third electrode, and the fourth electrode in a portion of a third region between a first region in which the first electrode and the second electrode are placed and a second region in which the third electrode and the fourth electrode is placed. It further has a first semiconductor chip, a second semiconductor chip, a third semiconductor chip, and a fourth semiconductor chip respectively bonded onto the upper surfaces of the first electrode, the second electrode, the third electrode, and the fourth electrode. It further has a first conductive member coupled to the surface of the first semiconductor chip and the upper surface of the fifth electrode, a second conductive member coupled to the surface of the second semiconductor chip and the exposed upper surface of the first electrode, a third conductive member coupled to the surface of the third semiconductor chip and the exposed upper surface of the fourth electrode, and a fourth conductive member coupled to the surface of the fourth semiconductor chip and the upper surface of the fifth electrode. It further has a fifth conductive member coupled to the exposed upper surface of the second electrode and the exposed upper surface of the third electrode. The lower surface of each of the first electrode, the second electrode, the third electrode, the fourth electrode, and the fifth electrode is exposed from the lower surface of the resin molding.

An advantageous effect available by the one mode of the typical invention disclosed herein will next be described briefly.

The invention makes it possible to reduce the size and thickness of a semiconductor device configuring a diode bridge circuit.

BRIEF DESCRIPTION OF THE DRAWINGS

FIG. 6 is a fragmentary plan view through which a resin molding on the surface side of a first modification example of the semiconductor device according to First Embodiment of the invention is seen;

FIG. 7 is a fragmentary plan view through which a resin molding on the surface side of a second modification example of the semiconductor device according to First Embodiment of the invention is seen;

DETAILED DESCRIPTION

Figure 1:
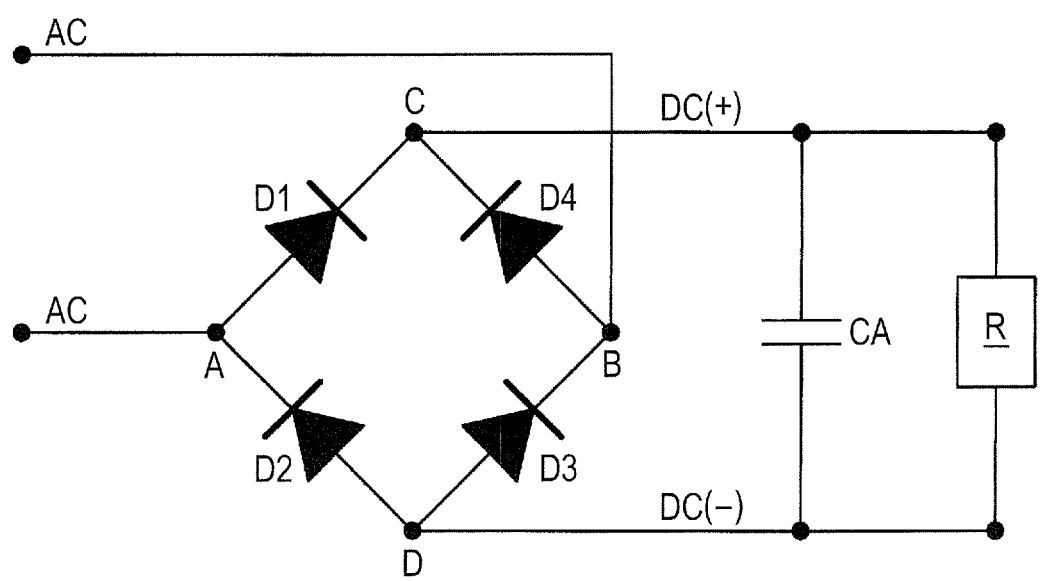
FIG. 1 is a circuit diagram of a diode bridge circuit according to First Embodiment of the invention.

In the following embodiment, a description will be made after divided into a plurality of sections or embodiments if necessary for convenience sake. They are not independent from each other, but in a relation such that one is a modification example, details, a complementary description, or the like of a part or whole of the other one unless otherwise specifically indicated.

And, in the below-described embodiments, when a reference is made to the number of elements (including the number, value, amount, range, or the like), the number is not limited to a specific number but may be greater than or less than the specific number, unless otherwise specifically indicated or principally apparent that the number is limited to the specific number. Further, in the below-described embodiments, it is needless to say that the constituting elements (including element steps or the like) are not always essential unless otherwise specifically indicated or principally apparent that they are essential. Similarly, in the below-described embodiments, when a reference is made to the shape, positional relationship, or the like of the constituting elements, that substantially approximate or similar to it is also embraced unless otherwise specifically indicated or principally apparent that it is not. This also applies to the above-described value and range.

In the drawings used in the below-described embodiment, some plan views may be hatched in order to facilitate viewing of them. In the below-described embodiments, the term "wafer" mainly means a Si (silicon) single crystal wafer, but the term "wafer" means not only it but also an SOI (silicon on insulator) wafer, an insulating film substrate for forming an integrated circuit thereover, or the like. The shape of the wafer is not limited to circular or substantially circular, but it may be square, rectangular or the like.

And, in all the drawings for describing the below-described embodiment, members of a like function will be identified by like reference numerals in principle and overlapping descriptions will be omitted. Hereafter, the embodiment of the invention will be described in detail based on drawings.

Figure 30A:
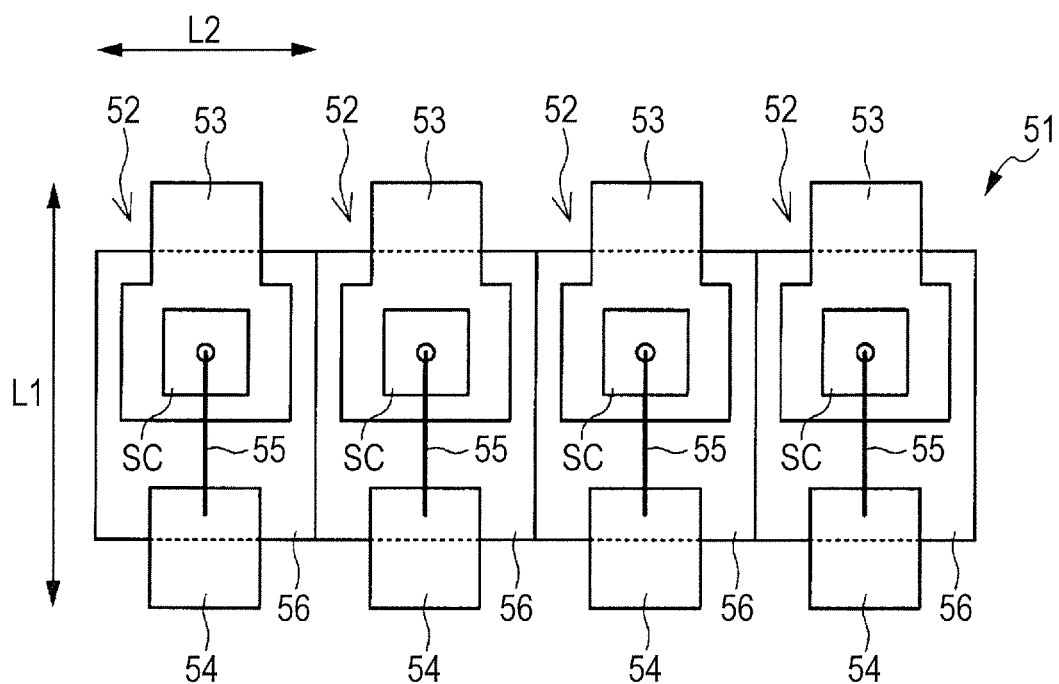
FIGS. 30A and 30B are a fragmentary plan view through which a resin molding on the surface side of a semiconductor device which configures a diode bridge circuit and was investigated by the present inventors is seen and a fragmentary side view of the semiconductor device.

In order to clearly show the structure of the semiconductor device configuring a diode bridge circuit according to the embodiment of the invention, the structure of a semiconductor device investigated by the present inventors and configuring a diode bridge circuit before application of the invention will next be described simply as a comparative example based on FIGS. 30A and 30B. FIG. 30A is a fragmentary plan view through which a resin molding on the surface side of the semiconductor device is seen and FIG. 30B is a fragmentary side view of the semiconductor device.

Figure 30B:
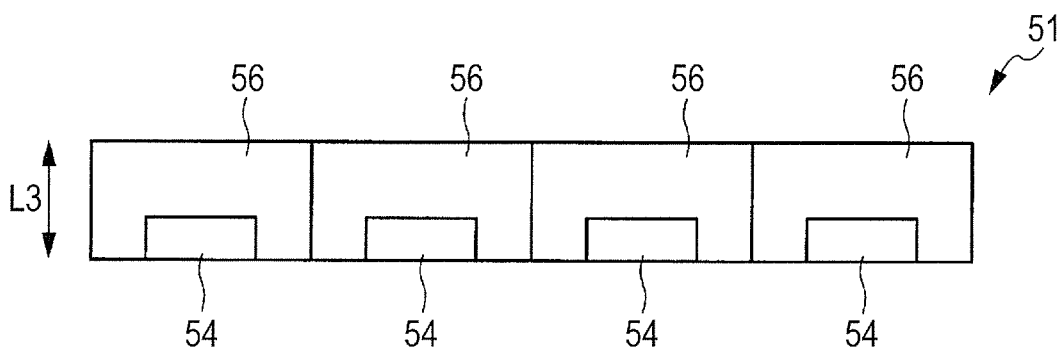

As shown in FIGS. 30A and 30B, a semiconductor device 51 configuring a diode bridge circuit is formed by connecting four diodes 52, each an independent part. This means that the semiconductor device 51 has a structure in which four semiconductor packages have been connected.

Each of the diodes 52 is equipped with a pair of a first lead 53 and a second lead 54 placed opposite to each other with a predetermined distance therebetween. The diode 52 is further equipped with a semiconductor chip SC mounted on the upper surface of the first lead 53, a wire 55 for electrically coupling the upper surface of the second lead 54 and a bonding pad formed on the surface of the semiconductor chip SC, and a resin molding 56 for sealing therewith the semiconductor chip SC and the wire 55.

The first lead 53 and the second lead 54 are formed, for example, by pressing a thin sheet metal having a thickness of about 0.11 mm and made of copper, iron, phosphor bronze or the like. The first lead 53 functions as a die bond electrode, with the semiconductor chip SC on its upper surface and it is exposed partially from the resin molding 56. The second lead 54 functions as a wire bond electrode with its upper surface being electrically coupled to the wire 55 and it is exposed partially from the resin molding 56.

The size of each of the portions configuring the diode 52, for example, a distance (space) between the first lead 53 and the second lead 54 opposite to each other, the thickness of the first lead 53, the thickness of the second lead 54, and the thickness of each site of the resin molding 56 is determined, depending on the breakdown voltage or the like which the semiconductor device 51 is required to have. For example, in the semiconductor device 51 required to have a breakdown voltage of 600V, the diode 52 having a longitudinal size (L1) of 2.5 mm, a lateral size (L2) of 1.25 mm, and a height size (L3) of 0.55 mm was obtained as a result of investigation by the present inventors. The semiconductor device 51 realized by connecting four such diodes 52 had a minimum area of 12.5 mm$^2$ and a thickness of 0.55 mm when viewed from the top.

First Embodiment

Diode Bridge Circuit

First, a diode bridge circuit according to First Embodiment will be described using the circuit diagram of a diode bridge circuit shown in FIG. 1.

As shown in FIG. 1, this diode bridge circuit is one of rectifier circuits for converting AC voltage to DC voltage and is comprised of four diodes D1, D2, D3, and D4. Full wave rectification (rectification of both the positive wave and the negative wave of AC current to make the flow directions the same) can be conducted by using these four diodes D1, D2, D3, and D4 in combination.

The diode bridge circuit has a first input terminal A at which one side of diode D1 and one side of diode D2 are coupled to each other, a second input terminal B at which one side of diode D3 and one side of diode D4 are coupled to each other, a first output terminal (positive voltage terminal) C at which the other side of diode D1 and the other side of diode D4 are coupled to each other, and a second output terminal (negative voltage terminal or GND terminal) D at which the other side of diode D2 and the other side of diode D3 are coupled to each other.

When an alternating current is caused to flow between the first input terminal A and the second input terminal B, during the term when the alternating current thus input is positive (the voltage of the first input terminal A being higher than the voltage of the second input terminal B), the diode D1 and the diode D3 conduct and the current flows to the diode D1, a resistor R (external load), and the diode D3. During the term when the alternating current thus input is negative (the voltage of the second input terminal B being higher than the voltage of the first input terminal A), the diode 2 and the diode D4 conduct and the current flows to the diode D4, the resistor R (external load), and the diode D2. With regards to the current flowing to the resistor R (external load), the current flows in the same direction both in the positive term and in the negative term. Thus, full wave rectification can be realized. It is possible to make the waveform of the current flowing to the resistor R (external load) close to that of the direct current by coupling the resistor R (external load) and a capacitor CA (smoothing circuit) in parallel to each other.

<Semiconductor Device>

Figure 2:
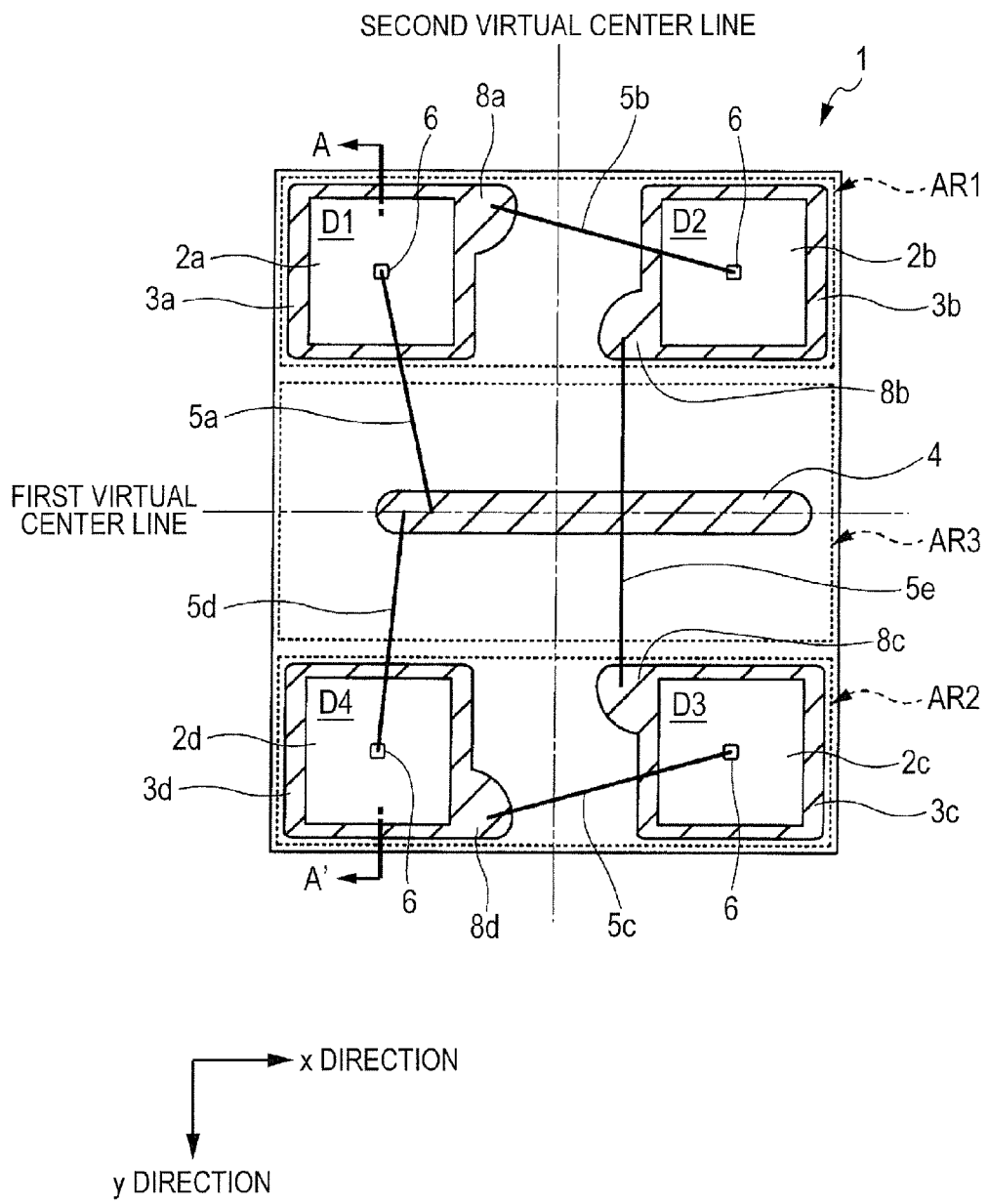
FIG. 2 is a fragmentary plan view through which a resin molding on the surface side of a semiconductor device of First Embodiment of the invention is seen.
Figure 3:
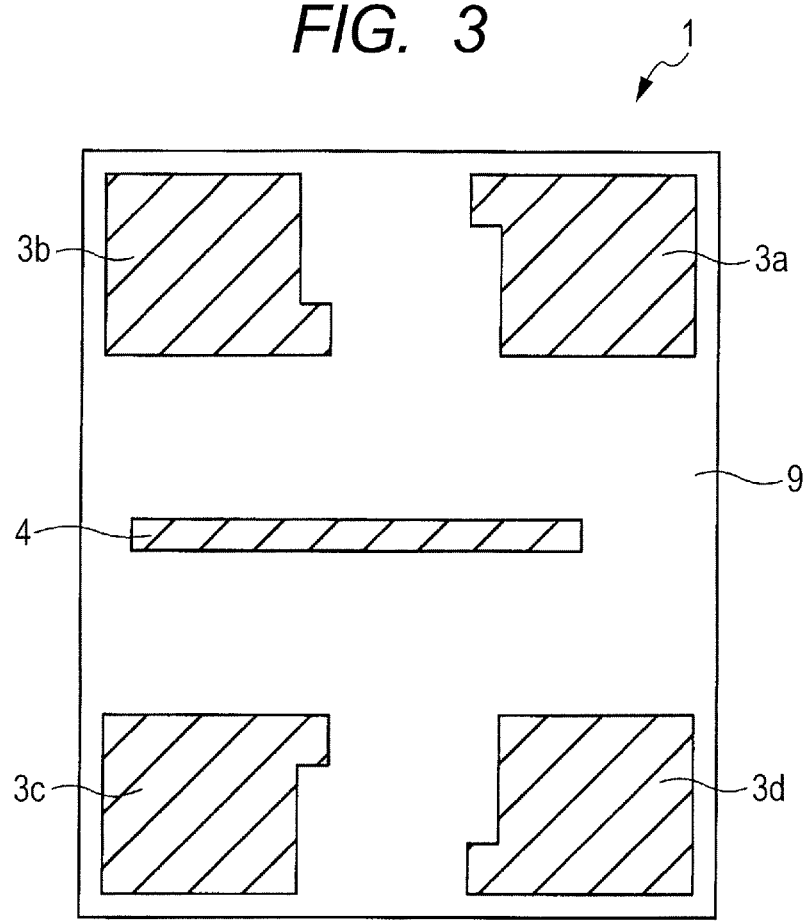
FIG. 3 is a fragmentary plan view of the semiconductor device shown in FIG. 2 on the back surface (mounting surface) side.
Figure 4:
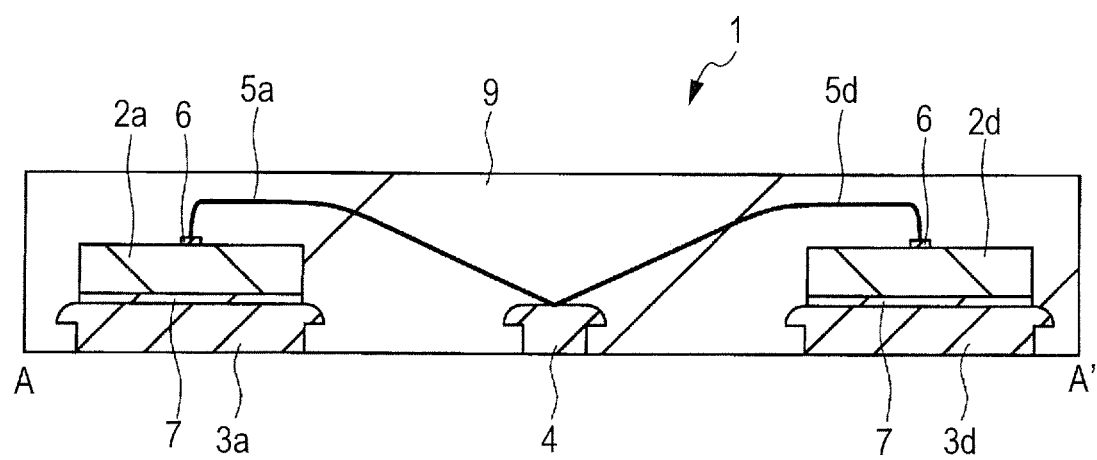
FIG. 4 is a fragmentary cross-sectional view of the semiconductor device shown in FIG. 2 (a fragmentary cross-sectional view corresponding to a cross-section (including two conductive members) taken along a line A-A' in FIG. 2)
Figure 5:
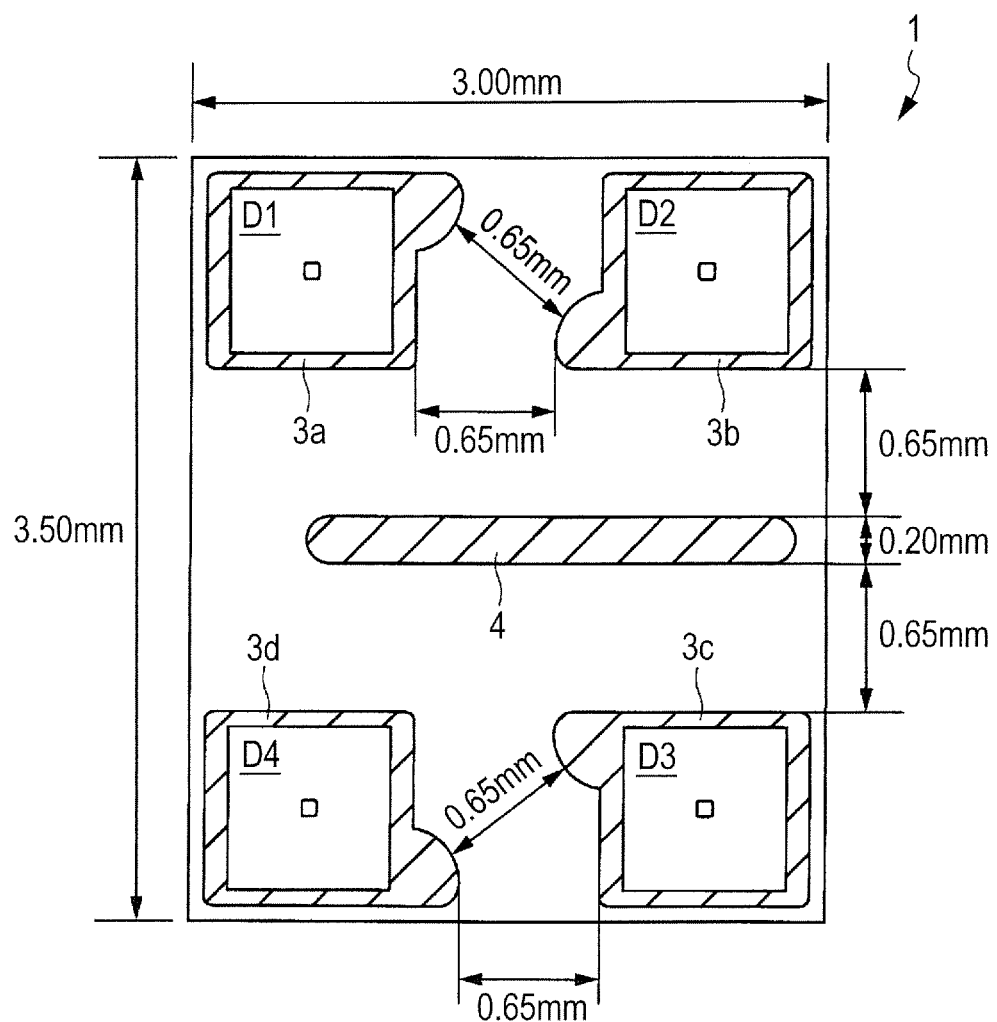
FIG. 5 is a fragmentary plan view of the semiconductor device showing one example of a typical size of each of the portions configuring the semiconductor device according to First Embodiment of the invention.

Next, the structure of the semiconductor device configuring a diode bridge circuit according to First Embodiment will be described referring to FIGS. 2 to 5. FIG. 2 is a fragmentary plan view through which a resin molding on the surface side of the semiconductor device is seen; FIG. 3 is a fragmentary plan view of the back surface (mounting surface) side of the semiconductor device shown in FIG. 2; FIG. 4 is a fragmentary cross-sectional view of the semiconductor device (a fragmentary cross-sectional view corresponding to a cross-section (including two conductive members) taken along the line A-A' in FIG. 2); and FIG. 5 is a fragmentary plan view of the semiconductor device showing one example of a typical size of each of the portions configuring the semiconductor device.

<Semiconductor Device 1>

As shown in FIGS. 2 to 4, a semiconductor device 1 is quadrangular when viewed from the top and has, along four sides thereof, a semiconductor chip (first semiconductor chip) 2a, a semiconductor chip (second semiconductor chip) 2b, a semiconductor chip (third semiconductor chip) 2c, and a semiconductor chip (fourth semiconductor chip) 2d which are spaced apart from each other, respectively. These semiconductor chips 2a, 2b, 2c, and 2d are integrated in one semiconductor package.

Further, the semiconductor device 1 has an electrode (first electrode) 3a, an electrode (second electrode) 3b, an electrode (third electrode) 3c, and an electrode (fourth electrode) 3d having thereon the semiconductor chips 2a, 2b, 2c, and 2d, respectively, and serving as an external terminal; and also has an electrode (fifth electrode) 4 spaced apart from each of the electrodes 3a, 3b, 3c, and 3d and serving as an external terminal.

Further, the semiconductor device 1 has a conductive member (first conductive member) 5a, a conductive member (second conductive member) 5b, a conductive member (third conductive member) 5c, a conductive member (fourth conductive member) 5d, and a conductive member (fifth conductive member) 5e.

<Semiconductor Chips 2a, 2b, 2c, and 2d>

The semiconductor chips 2a, 2b, 2c, and 2d each have a surface and a back surface which is on the side opposite to the surface. The semiconductor chips 2a, 2b, 2c, and 2d have the diodes D1, D2, D3, and D4, respectively. A bonding pad (electrode pad, surface electrode) 6 formed on the surface of the semiconductor chips 2a, 2b, 2c, and 2d and the back surface of the semiconductor chips 2a, 2b, 2c, and 2d are used as two terminals of the diodes D1, D2, D3, and D4. This means that the bonding pad 6 formed on the surface of the semiconductor chips 2a, 2b, 2c, and 2d serves as a cathode terminal, while the back surface of the semiconductor chips 2a, 2b, 2c, and 2d serves as an anode terminal.

In the following description, the relationship between the diodes D1, D2, D3, and D4 and the semiconductor chips 2a, 2b, 2c, and 2d is clearly shown by calling them as follows: the semiconductor chip 2a having the diode D1, the semiconductor chip 2b having the diode D2, the semiconductor chip 2c having the diode D3, and the semiconductor chip 2d having the diode D4 will hereinafter be called "semiconductor chip 2a[D1]", "semiconductor chip 2b[D2]", "semiconductor chip 2c[D3]", and "semiconductor chip 2d[D4]", respectively.

The bonding pad 6 formed on the surface of the semiconductor chips 2a[D1], 2b[D2], 2c[D3], and 2d[D4] is made of a metal film, for example, aluminum (Al) and is exposed from an opening portion (not illustrated) formed in a surface protecting film (not illustrated) for protecting the diodes D1, D2, D3, and D4.

<Electrodes 3a, 3b, 3c, and 3d, and Electrode 4>

The electrodes (electrode plates, die islands) 3a, 3b, 3c, and 3d, and the electrode 4 (electrode plate) have an upper surface (surface) and a lower surface (back surface, mounting surface) on the side opposite to the upper surface.

The electrodes 3a, 3b, 3c, and 3d are spaced apart along the four sides of the semiconductor device 1, respectively. The electrode 3b is spaced apart from the electrode 3a in a x direction (first direction) with a predetermined distance, the electrode 3d is spaced apart from the electrode 3a in a y direction (second direction) orthogonal to the x direction with a predetermined distance, the electrode 3c is spaced apart from the electrode 3d in the x direction with a predetermined distance.

The back surfaces of the semiconductor chips 2a[D1], 2b[D2], 2c[D3], and 2d[D4] face to the upper surfaces of the electrodes 3a, 3b, 3c, and 3d, respectively and the semiconductor chips 2a[D1], 2b[D2], 2c[D3], and 2d[D4] are bonded onto the upper surfaces of the electrodes 3a, 3b, 3c, and 3d, respectively via a conductive resin material (conductive resin paste) 7. Accordingly, the semiconductor chip 2b[D2] is spaced apart from the semiconductor chip 2a[D1] in the x direction; the semiconductor chip 2d[D4] is spaced apart from the semiconductor chip 2a[D1] in the y direction; and the semiconductor chip 2c[D3] is spaced apart from the semiconductor chip 2d[D4] in the x direction. The conductive resin material 7 is made of, for example, silver (Ag).

The electrode 4 extends in the x direction with a predetermined width in the y direction in a portion of a third region A3 present between a first region AR1 in which the electrode 3a and the electrode 3b have been placed and a second region AR2 in which the electrode 3c and the electrode 3d have been placed. It is spaced apart from each of the electrodes 3a, 3b, 3c, and 3d. When viewed from the top, relative to a first virtual center line which bisects between the electrode 3a and the electrode 3d, the electrode 3a and the electrode 3d are placed symmetrically and the electrode 3b and the electrode 3c are placed symmetrically while sandwiching the electrode 4 therebetween. When viewed from the top, relative to a second virtual center line which bisects between the electrode 3a and the electrode 3b, the electrode 3a and the electrode 3b are placed symmetrically and the electrode 3d and the electrode 3c are placed symmetrically.

An alternating current flows to each of the back surface (anode) of the semiconductor chip 2a[D1] and the back surface of the semiconductor chip 2d[D4]. The electrode 3a to which the back surface of the semiconductor chip 2a[D1] is coupled corresponds to a first input terminal A of the diode bridge circuit and the electrode 3d to which the back surface of the semiconductor chip 2d[D4] is coupled corresponds to a second input terminal B of the diode bridge circuit.

On the other hand, a direct current flows to the back surface (anode) of the semiconductor chip 2b[D2] and the back surface (anode) of the semiconductor chip 2c[D3] and also a direct current flows to the electrode 4 to which the surface (cathode) of the semiconductor chip 2a[D1] and the surface (cathode) of the semiconductor chip 2d[D4] are coupled. The electrode 3b to which the back surface of the semiconductor chip 2b[D2] is coupled and the electrode 3c to which the back surface of the semiconductor chip 2c[D3] is coupled correspond to a second output terminal (negative voltage terminal or GND terminal) D of the diode bridge circuit, while the electrode 4 corresponds to a first output terminal (positive voltage terminal) C of the diode bridge circuit. The electrode 3b and the electrode 3c have the same potential.

In First Embodiment, an alternating current flows to the electrode 3a and the electrode 3d and a direct current flows to the electrode 3b, the electrode 3c, and the electrode 4. In order to avoid mutual influence between the alternating current side and the direct current side, the electrode 3b, the electrode 3c, and the electrode 4 are placed with a predetermined distance from the electrode 3a and the electrode 3d to which an alternating current flows.

The electrodes 3a, 3b, 3c, and 3d and the electrode 4 are each a plated film formed (deposited) by plating. More specifically, a nickel (Ni) film is deposited on a gold (Au) film and on the resulting nickel (Ni) film, a silver (Ag) film is deposited. The thickness of the gold (Au) film is, for example, 0.1 μm, the thickness of the nickel (Ni) film is, for example, 60 μm, and the thickness of the silver (Ag) film is, for example, 3 μm. Instead of the silver (Ag) film, a gold (Au) film may be formed on the nickel (Ni) film.

When viewed from the top, the electrodes 3a, 3b, 3c, and 3d are basically quadrangular and have a curvature portion at the corner portion thereof. Since the conductive members 5b, 5c, and 5e are coupled to the electrodes 3a, 3b, 3c, and 3d, a region for coupling should be secured. The shape of the electrodes 3a, 3b, 3c, and 3d in the top view is comprised of a first shape portion and a second shape portion. The first shape portion is mainly a region where the semiconductor chips 2a, 2b, 2c, and 2d are mounted and it is a guadrangular portion when viewed from the top. The second shape portion is each of coupling portions 8a, 8b, 8c, and 8d for coupling the conductive members 5b, 5c, and 5e and is a portion protruding from a portion of the one side of the first shape portion (quadrangle) in the top view. These coupling regions 8a, 8b, 8c, and 8d are integrated with the quadrangular regions in the top view, respectively, and are curved (without having a sharp angle) in the top view. The coupling region 8a of the electrode 3a and the coupling region 8b of the electrode 3b are placed so as to be opposite diagonally relative to the second virtual center line. Similarly, the coupling region 8c of the electrode 3c and the coupling region 8d of the electrode 3d are placed so as to be opposite diagonally relative to the second virtual center line.

<Conductive Members 5a, 5b, 5c, 5d, and 5e>

The bonding pad 6 provided on the surface of the semiconductor chip 2a[D1] and the upper surface of the electrode 4 are electrically coupled to each other with the conductive member 5a and the bonding pad 6 provided on the surface of the semiconductor chip 2d[D4] and the upper surface of the electrode 4 are electrically coupled to each other with the conductive member 5d. The bonding pad 6 provided on the surface of the semiconductor chip 2b[D2] and the exposed upper surface of the electrode 3a (coupling region 8a) to which the back surface of the semiconductor chip 2a[D1] is coupled are electrically coupled to each other with the conductive member 5b. The bonding pad 6 provided on the surface of the semiconductor chip 2c[D3] and the exposed upper surface of the electrode 3d (coupling region 8d) to which the back surface of the semiconductor chip 2d[D4] is coupled are electrically coupled to each other with the conductive member 5c. Further, the exposed upper surface of the electrode 3b (coupling region 8b) to which the back surface of the semiconductor chip 2b[D2] is coupled and the exposed upper surface of the electrode 3c (coupling region 8c) to which the back surface of the semiconductor chip 2c[D3] is coupled are electrically coupled to each other with the conductive member 5e. As the conductive members 5a, 5b, 5c, 5d, and 5e, for example a wire (gold (Au) wire) is used.

<Resin Molding 9>

Portions (surface and side surface) of the semiconductor chips 2a[D1], 2b[D2], 2c[D3], and 2d[D4], a portion (side surface) of the electrodes 3a, 3b, 3c, and 3d, portions (upper surface and side surface) of the electrode 4, and the conductive members 5a, 5b, 5c, 5d, and 5e are sealed by a resin molding (molding) 9. From the lower surface (back surface) of the resin molding 9, however, the other portion (lower surface) of the electrodes 3a, 3b, 3c, and 3d, and the electrode 4 are exposed.

In addition, the conductive member 5e which electrically couples the electrode 3b to which the back surface of the semiconductor chip 2b[D2] is coupled and the electrode 3c to which the back surface of the semiconductor chip 2c[D3] is coupled is formed so as to stride over the electrode 4 but the space between the conductive member 5e and the electrode 4 is sealed with the resin molding (molding) 9.

<Typical Size of Each Portion of Semiconductor Device 1>

The size of each of the portions configuring the semiconductor device 1 is determined, depending mainly on the breakdown voltage of the semiconductor device 1. The size of each portion will next be exemplified while setting the breakdown voltage at 600V which the semiconductor device 1 is required to have, but the size of each portion is not limited to it.

FIG. 5 shows one example of the typical size of the portions configuring the semiconductor device 1. The breakdown voltage of the semiconductor device 1 is determined, depending on, in addition to the breakdown voltage of the diode D1, D2, D3, or D4 itself, the distance between the electrode 3a and the electrode 3b adjacent to each other, the distance between the electrode 3c and the electrode 3d adjacent to each other, and the distance between the electrodes 3a, 3b, 3c, and 3d and the electrode 4. In First Embodiment, the shortest distance of the electrode 3a and the electrode 3b adjacent to each other, the shortest distance between the electrode 3c and the electrode 3d adjacent to each other, and the shortest distance between the electrodes 3a, 3b, 3c, and 3d and the electrode 4 are adjusted to the same distance and the shortest distance is set at 0.65 mm. The shortest distance is set longer than a limit distance of the breakdown voltage (3 kV/1 mm) of air.

In the conductive member 5a shown in FIG. 2 and electrically coupling the bonding 6 provided on the surface of the semiconductor chip 2a[D1] and the upper surface of the electrode 4, a linear distance from one end to the other end of the member when viewed from the top is set longer than the limit distance of the breakdown voltage (20 kV/1 mm) of the resin molding. Similarly, in the conductive member 5d shown in FIG. 2 and electrically coupling the bonding 6 provided on the surface of the semiconductor chip 2d[D4] and the upper surface of the electrode 4, a linear distance from one end to the other end of the member when viewed from the top is set longer than the limit distance of the breakdown voltage (20 kV/1 mm) of the resin molding.

The thickness of each of the electrodes 3a, 3b, 3c, and 3d, and the electrode 4 is set at, for example, from 0.05 to 0.07 mm. Using plating enables formation of the electrodes 3a, 3b, 3c, and 3d, and the electrode 4 with a thickness not greater than about the half of the thickness of a lead comprised of a portion of a leadframe formed by patterning a conductive substrate (metal plate).

Thus, the semiconductor device 1 is designed while considering the arrangement of the electrodes 3a, 3b, 3c, and 3d (semiconductor chips 2a[D1], 2b[D2], 2c[D3], and 2d[D4]), the arrangement of the electrode 4, the shortest distance between the electrodes adjacent to each other (for example, between the electrode 3a and the electrode 3b, between the electrode 3c and the electrode 3d, and between the electrodes 3a, 3b, 3c, and 3d and the electrode 4) or the like. As a result, in First Embodiment, the semiconductor device 1 thus manufactured has an area of from about 10 to 11 mm$^2$ when viewed from the top, and a thickness of from 0.36 to 0.40 mm. This means that the semiconductor device 1 thus manufactured is smaller and thinner than the semiconductor device 51, shown above in FIG. 30, which is obtained by connecting four diodes 52, each an independent part, to each other.

<Modification Example of Semiconductor Device>

Arrangement of the electrodes corresponding to the first input terminal A, the second input terminal B, the first output terminal C, and the second output terminal D of the semiconductor device 1 according to First Embodiment is not limited to the above-mentioned arrangement shown in FIGS. 2 to 4.

A first modification example and a second modification example of the arrangement of the electrodes of First Embodiment will next be described referring to FIGS. 6 and 7. FIG. 6 is a fragmentary plan view of a semiconductor device for describing the first modification example, while FIG. 7 is a fragmentary plan view of a semiconductor device for describing the second modification example. Both FIGS. 6 and 7 show a fragmentary plan view through which a resin molding on the surface side of the semiconductor device is seen.

In the above-mentioned semiconductor device 1, the electrode 3b and the electrode 3c corresponding to the second output terminal D and having the same potential are formed separately. In a semiconductor device 1A of the first modification example, as shown in FIG. 6, an electrode corresponding to the second output terminal D is made of one electrode (electrode plate, die island) 3bc. This means that a portion of the electrode on which the semiconductor chip 2b[D2] is mounted and a portion of the electrode on which the semiconductor chip 2c[D3] is mounted are formed integrally by the same conductive member.

The conductive member 5e (refer to the above-mentioned FIG. 2) electrically coupling the electrode 3b and the electrode 3c in the above-mentioned semiconductor device 1 becomes unnecessary in the semiconductor device 1A of the first modification example. The shortest distance between the electrode 3bc and the electrode 4 is determined by the breakdown voltage between them or the like.

In the above-mentioned semiconductor device 1, the electrode 4 is formed in a region between the electrode 3b and the electrode 3c and the conductive member 5e electrically coupling the electrode 3b and the electrode 3c is formed over the electrode 4 so as to stride over the electrode 4. In a semiconductor device 1B of the second modification example, on the other hand, no electrode 4 is formed in a region between the electrode 3b and the electrode 3c as shown in FIG. 7. Accordingly, the electrode 4 is not formed below the conductive member 5e electrically coupling the electrode 3b and the electrode 3c.

Thus, problems such as contact between the electrode 4 and the conductive member 5e do not occur in the first modification example and the second modification example.

<Method of Manufacturing a Semiconductor Device>

Next, one example of a manufacturing method of a semiconductor device configuring a diode bridge circuit according to First Embodiment of the invention will be described in the order of steps referring to FIG. 8 to FIG. 27.

Figure 8:
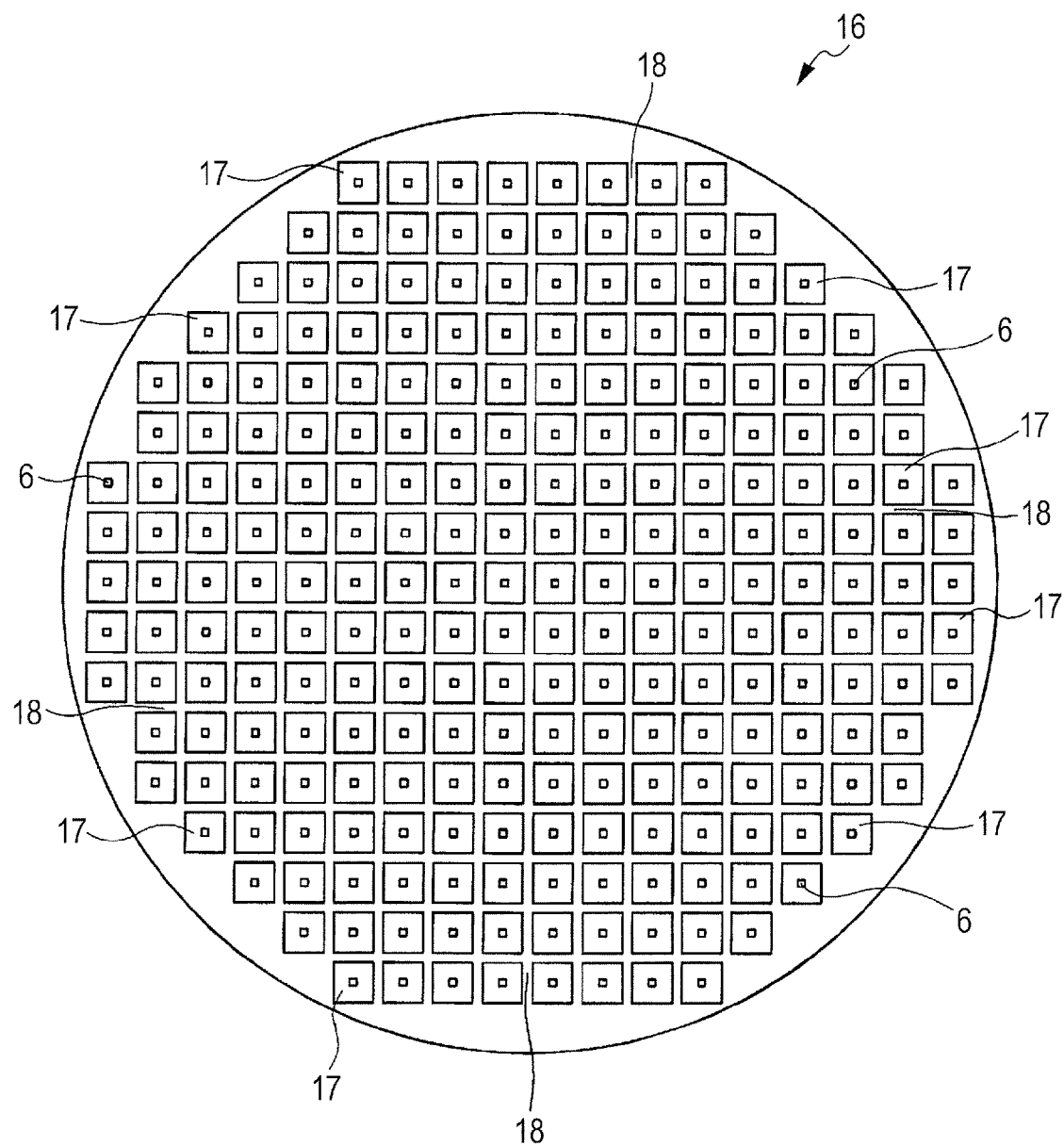
FIG. 8 is a fragmentary top view of a semiconductor wafer in a manufacturing step (wafer providing step) for describing a method of manufacturing the semiconductor device according to First Embodiment of the invention.
Figure 9:
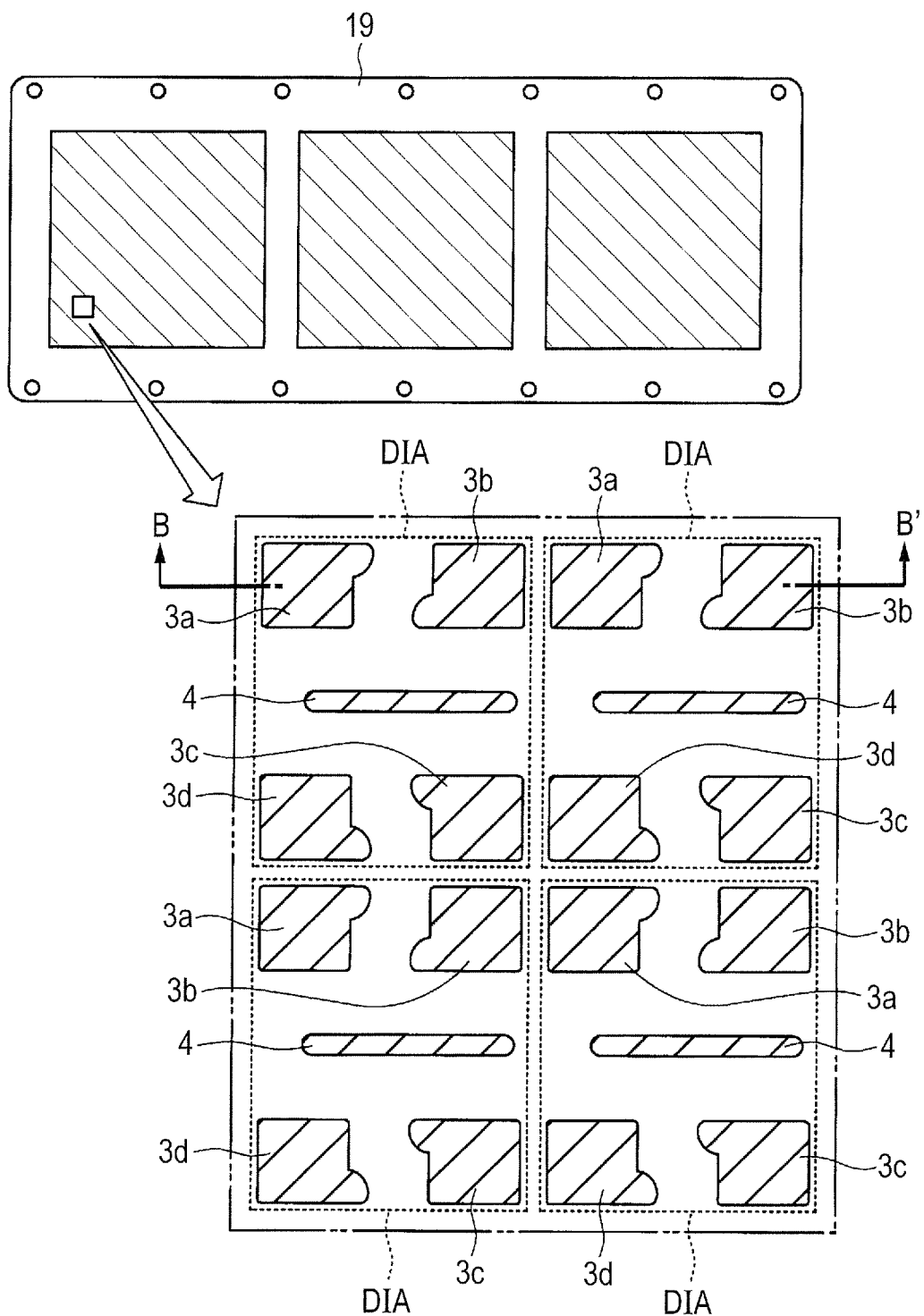
FIG. 9 is a fragmentary top view of a mother substrate according to First Embodiment of the invention.
Figure 10:
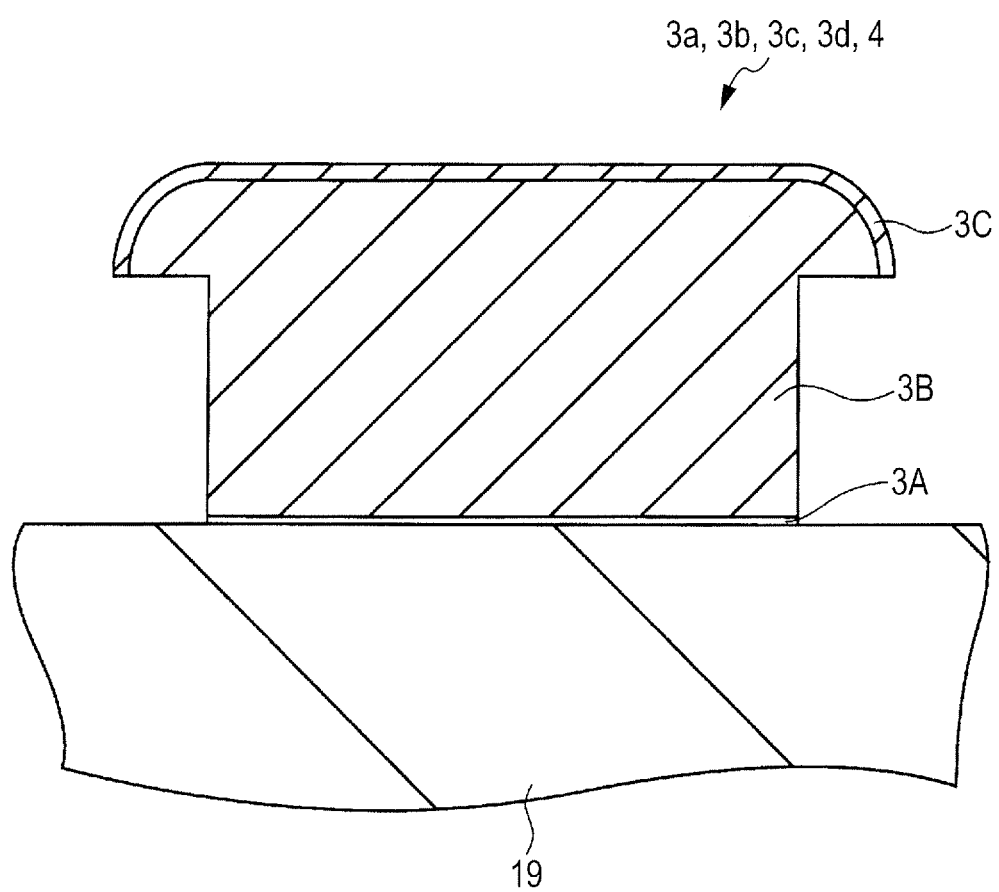
FIG. 10 is an enlarged fragmentary cross-sectional view of one electrode (external terminal) according to First Embodiment of the invention.
Figure 11:
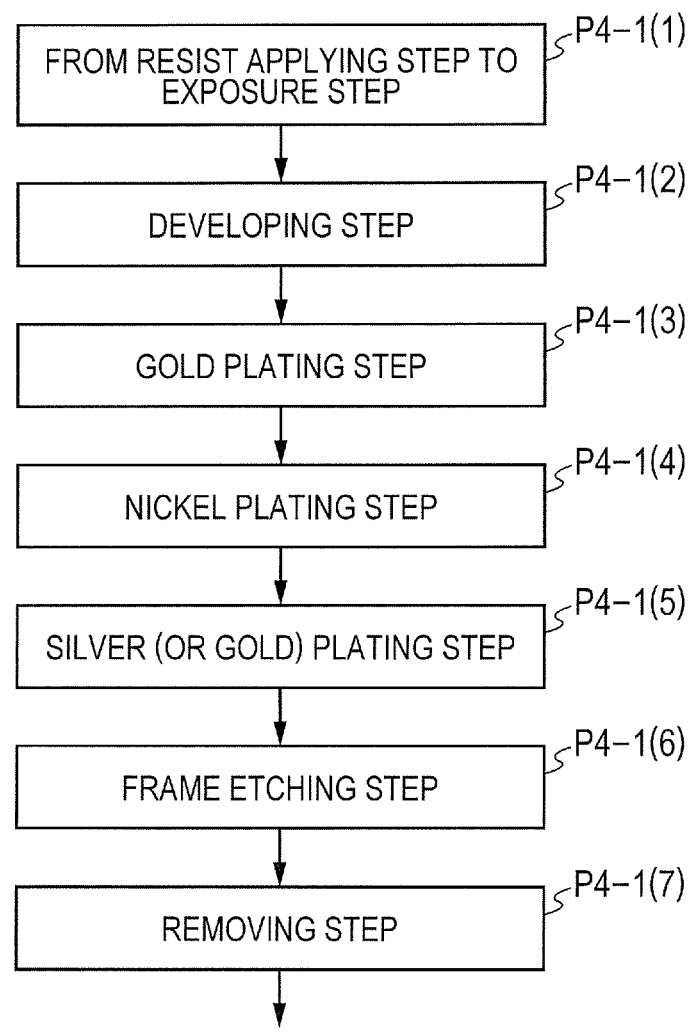
FIG. 11 is a flow chart for describing a manufacturing method of a mother substrate having a plurality of electrodes (external terminals) according to First Embodiment of the invention.
Figure 17:
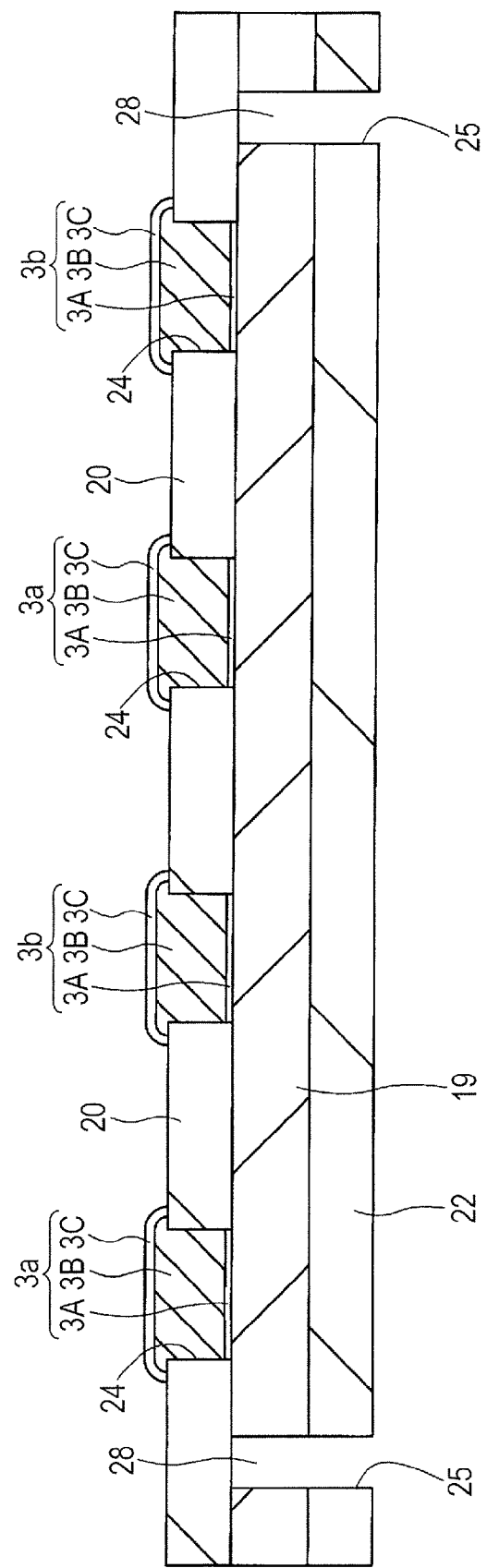
FIG. 17 is a fragmentary cross-sectional view (following FIG. 16, the fragmentary cross-sectional view showing the same portion as that of FIG. 12) of the mother substrate in a manufacturing step of the mother substrate having a plurality of electrodes (external terminals) according to First Embodiment of the invention.
Figure 18:
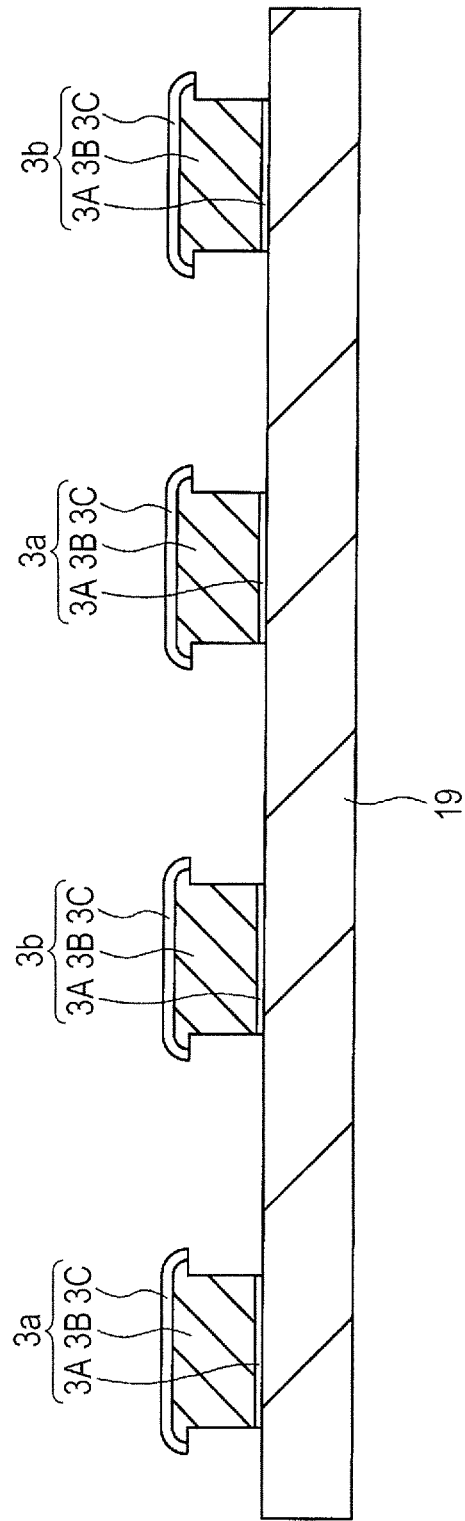
FIG. 18 is a fragmentary cross-sectional view (following FIG. 17, the fragmentary cross-sectional view showing the same portion as that of FIG. 12) of the mother substrate in a manufacturing step of the mother substrate having a plurality of electrodes (external terminals) according to First Embodiment of the invention.
Figure 19:
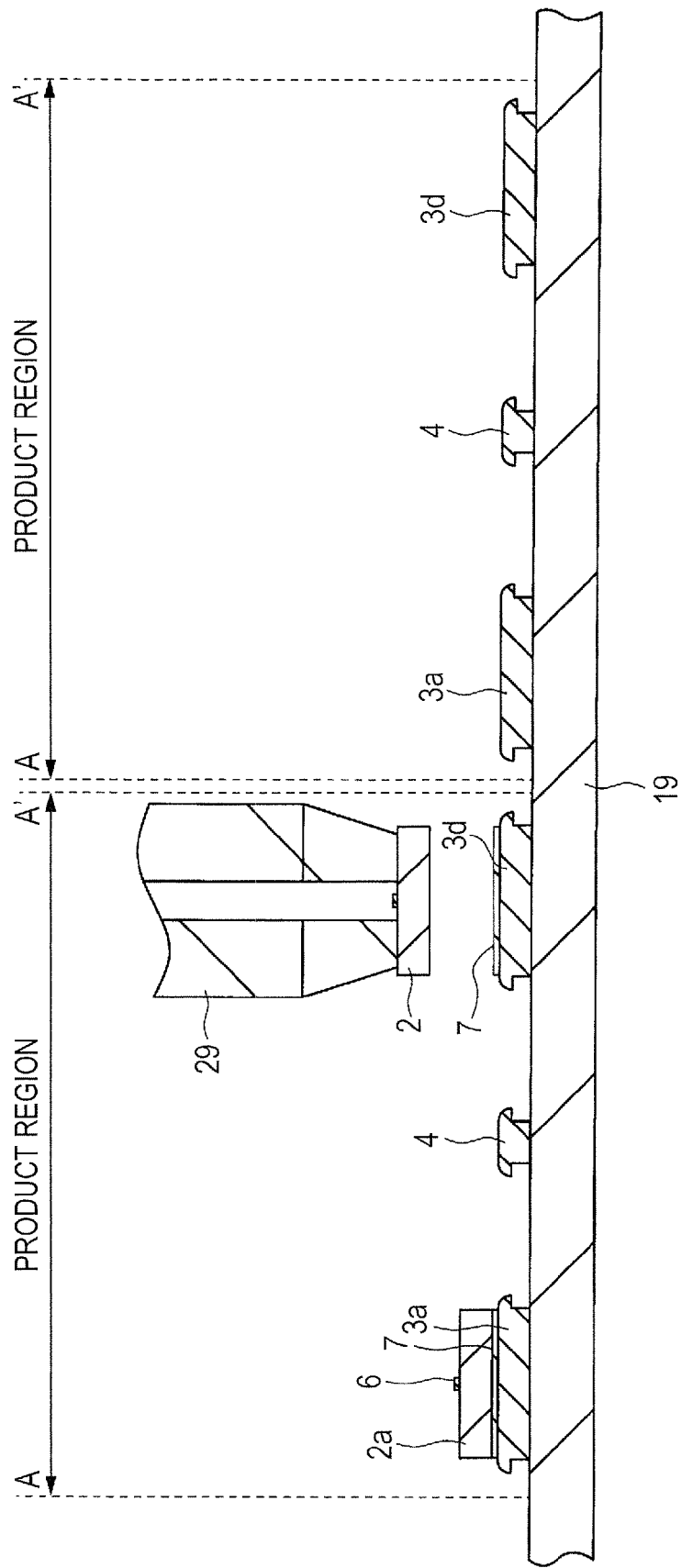
FIG. 19 is a fragmentary cross-sectional view (a fragmentary cross-sectional view corresponding to the cross-section (including two conductive members) taken along the line A-A' of FIG. 2) of a product region of the mother substrate in a manufacturing step (die bonding step) for describing the manufacturing method of the semiconductor device according to First Embodiment of the invention.
Figure 20:
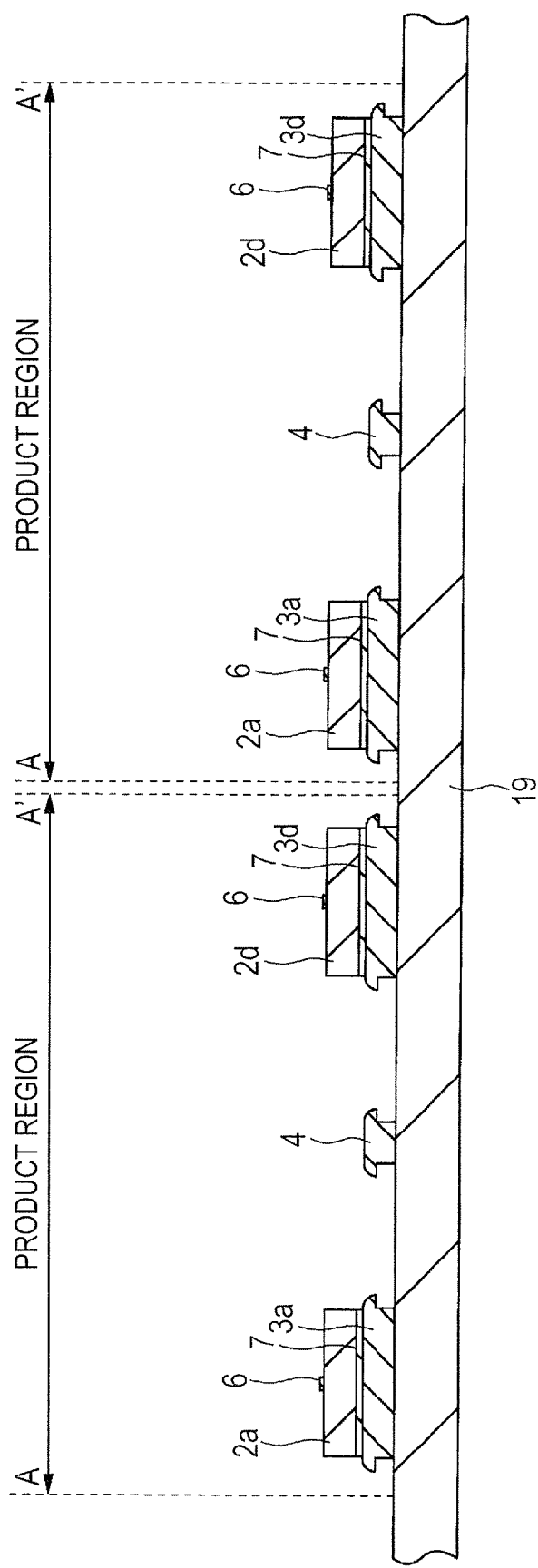
FIG. 20 is a fragmentary cross-sectional view (a fragmentary cross-sectional view corresponding to the cross-section (including two conductive members) taken along the line A-A' of FIG. 2) of the product region of the mother substrate in a manufacturing step (conductive resin paste baking step) for describing the manufacturing method of the semiconductor device according to First Embodiment of the invention.
Figure 21:
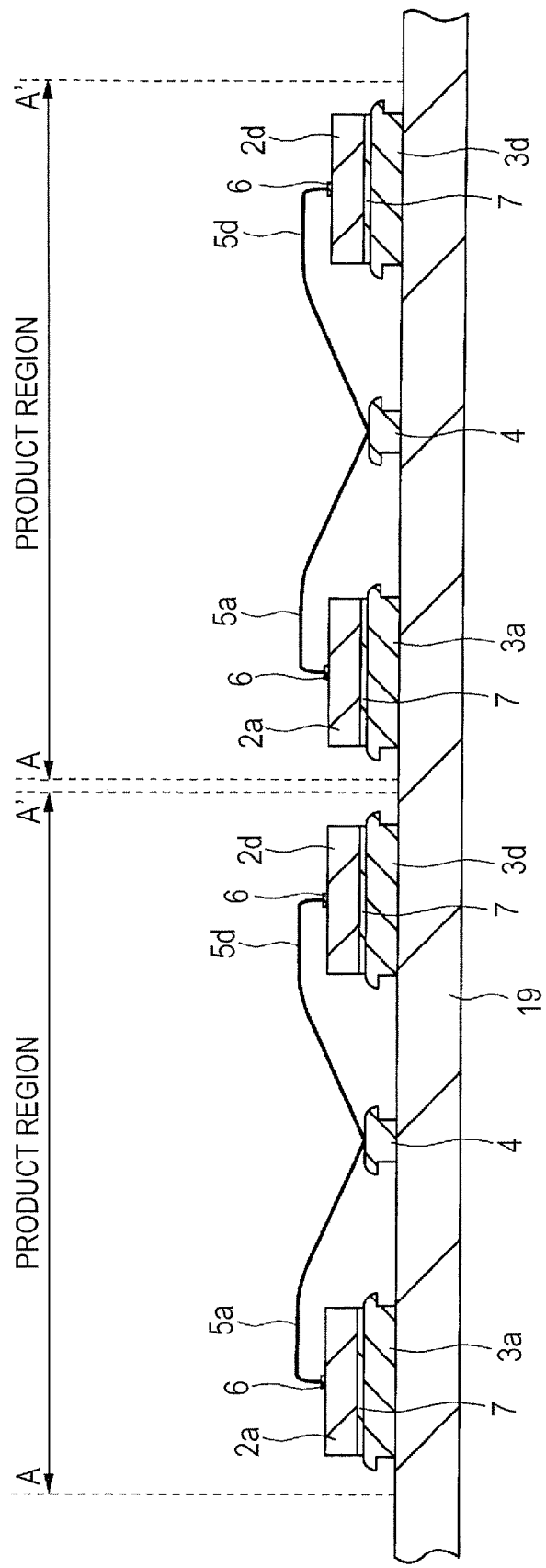
FIG. 21 is a fragmentary cross-sectional view (a fragmentary cross-sectional view corresponding to the cross-section (including two conductive members) taken along the line A-A' of FIG. 2) of the product region of the mother substrate in a manufacturing step (wire bonding step) for describing the manufacturing method of the semiconductor device according to First Embodiment of the invention.
Figure 22:
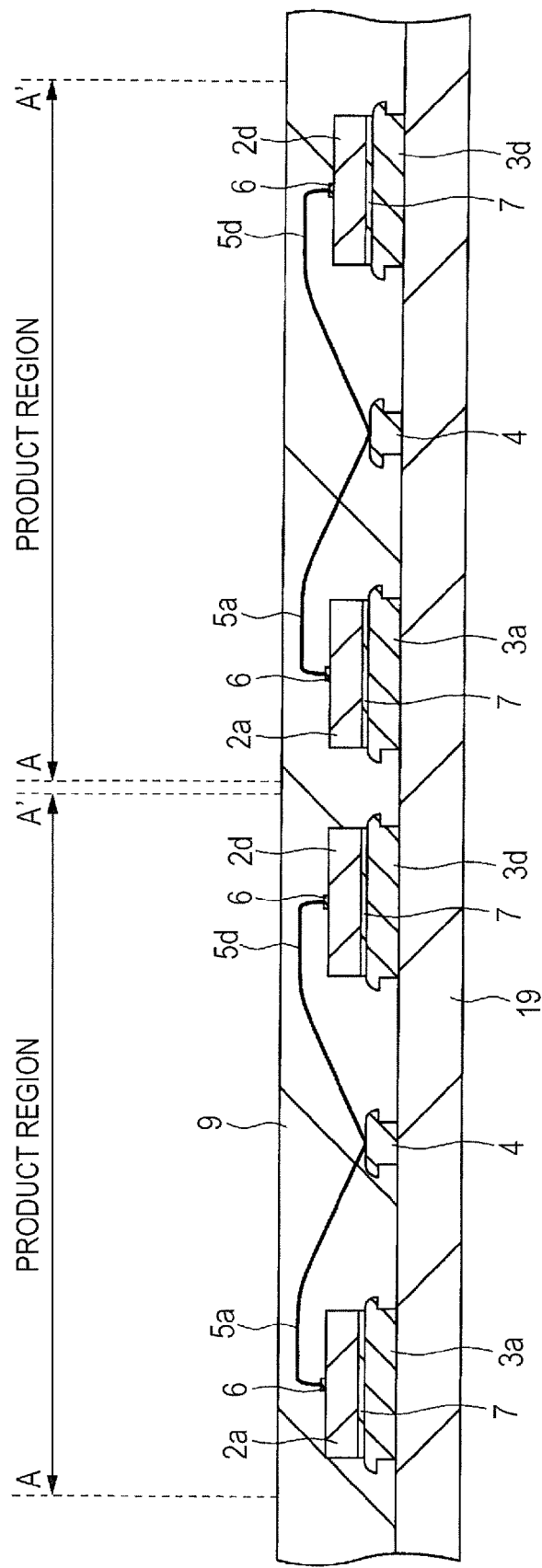
FIG. 22 is a fragmentary cross-sectional view (a fragmentary cross-sectional view corresponding to the cross-section (including two conductive members) taken along the line A-A' of FIG. 2) of the product region of the mother substrate in a manufacturing step (molding step) for describing the manufacturing method of the semiconductor device according to First Embodiment of the invention.
Figure 23:
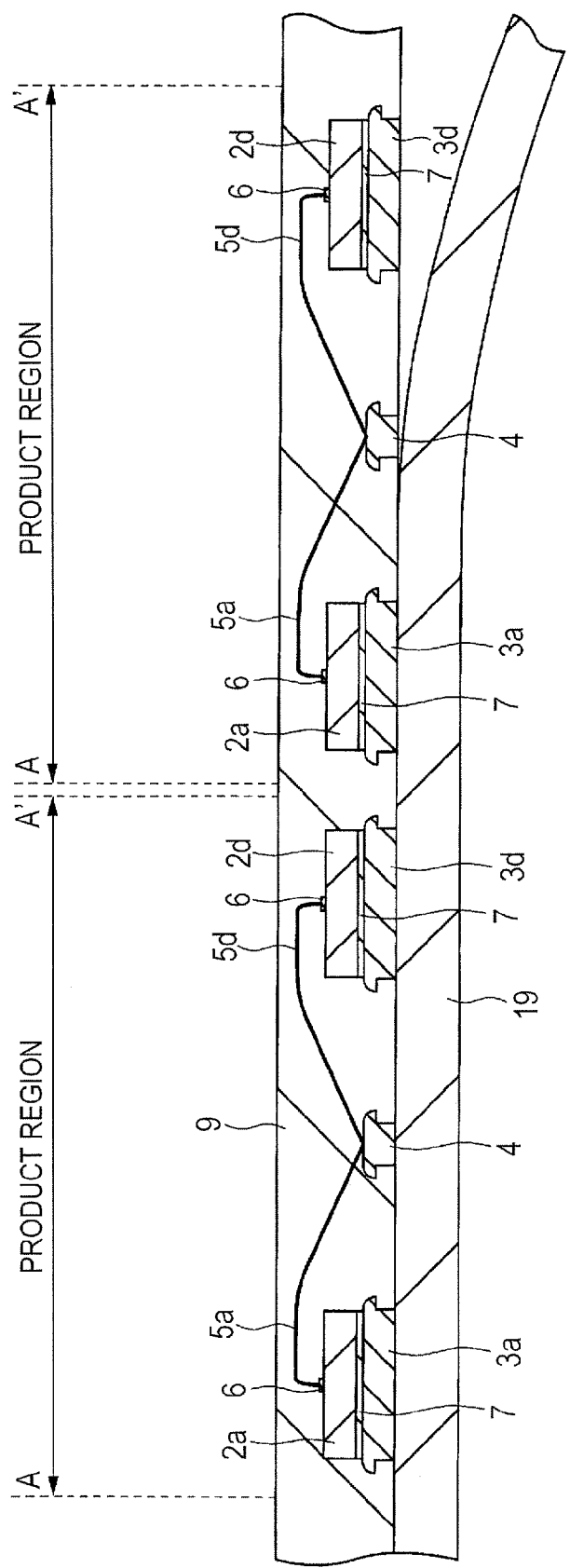
FIG. 23 is a fragmentary cross-sectional view (a fragmentary cross-sectional view corresponding to the cross-section (including two conductive members) taken along the line A-A' of FIG. 2) of the product region of the mother substrate in a manufacturing step (mother substrate peeling step) for describing the manufacturing method of the semiconductor device according to First Embodiment of the invention.
Figure 24:
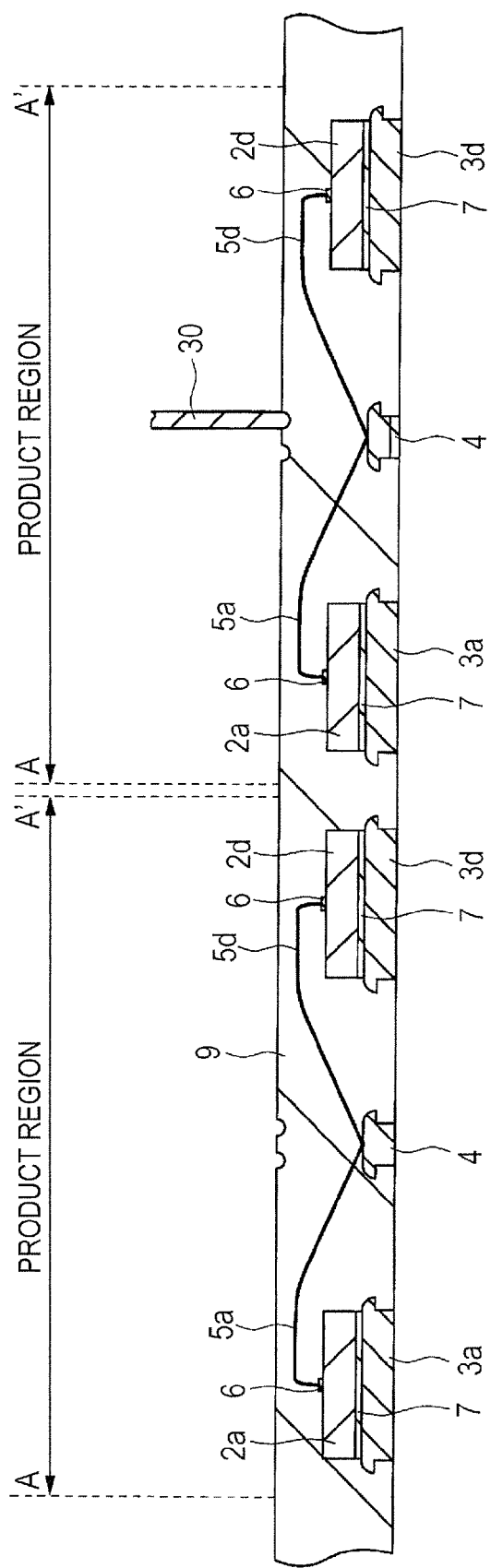
FIG. 24 is a fragmentary cross-sectional view (a fragmentary cross-sectional view corresponding to the cross-section (including two conductive members) taken along the line A-A' of FIG. 2) of the product region of the mother substrate in a manufacturing step (laser marking step) for describing the manufacturing method of the semiconductor device according to First Embodiment of the invention.
Figure 25:
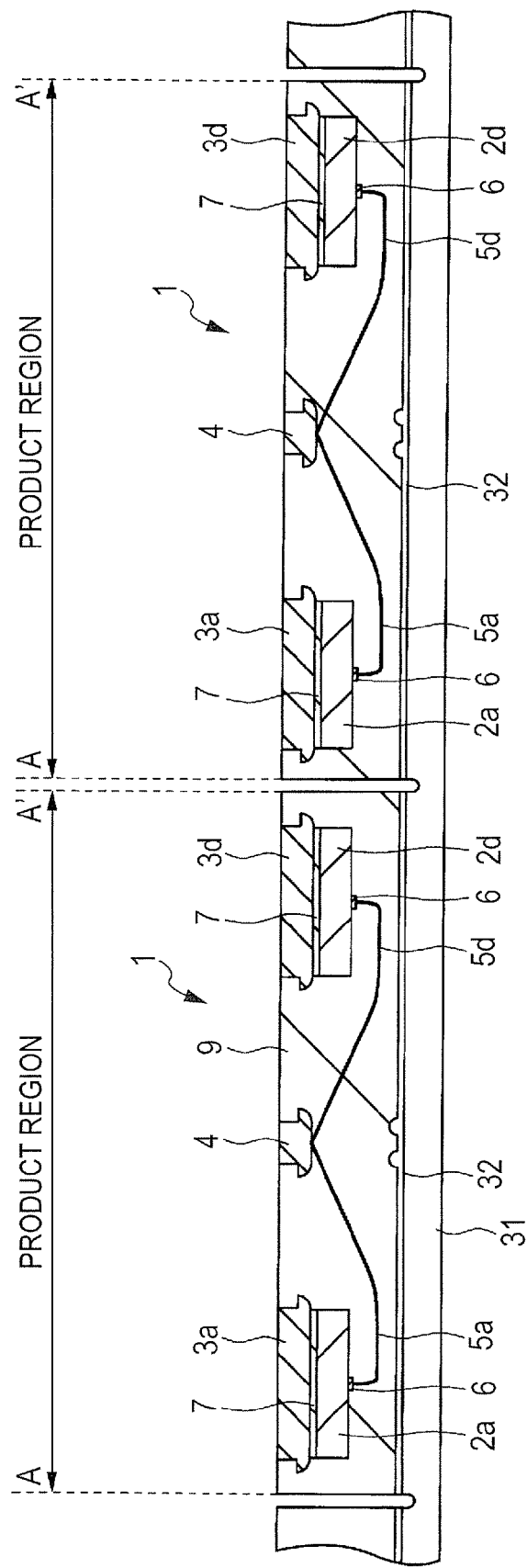
FIG. 25 is a fragmentary cross-sectional view (a fragmentary cross-sectional view corresponding to the cross-section (including two conductive members) taken along the line A-A' of FIG. 2) of the product region of the mother substrate in a manufacturing step (package dicing step) for describing the manufacturing method of the semiconductor device according to First Embodiment of the invention.
Figure 26:
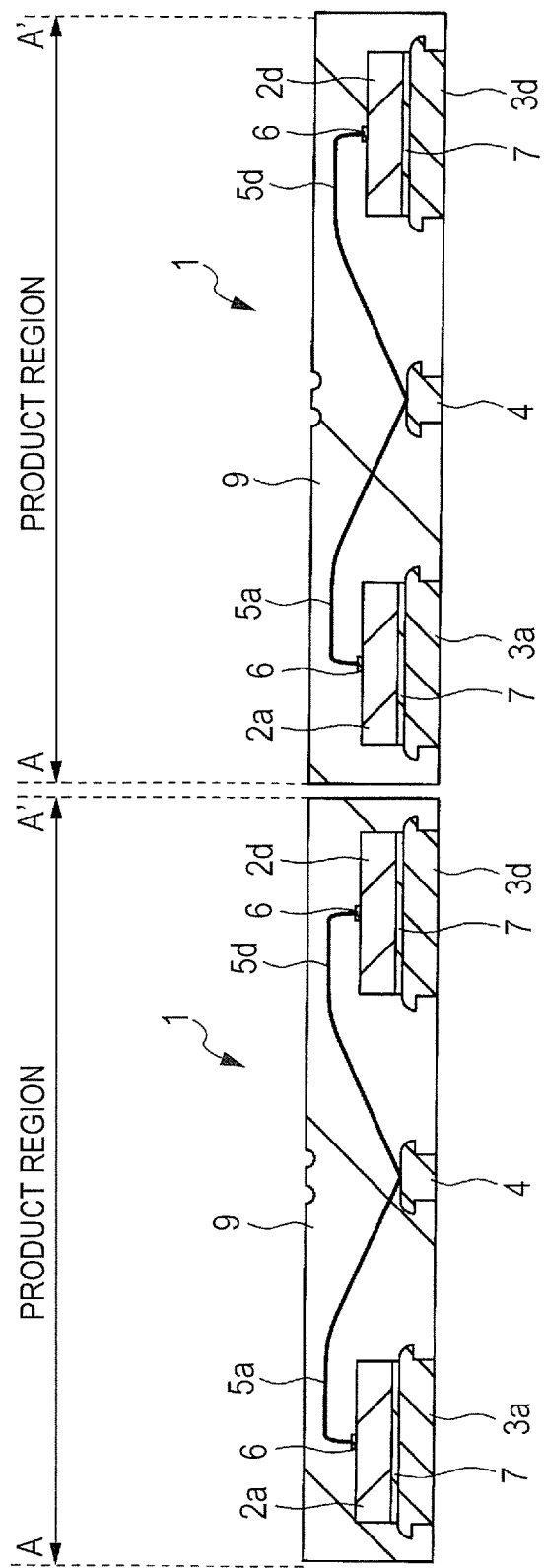
FIG. 26 is a fragmentary cross-sectional view (a fragmentary cross-sectional view corresponding to the cross-section (including two conductive members) taken along the line A-A' of FIG. 2) of the product region of the mother substrate in a manufacturing step (dicing sheet removing step) for describing the manufacturing method of the semiconductor device according to First Embodiment of the invention.
Figure 27:
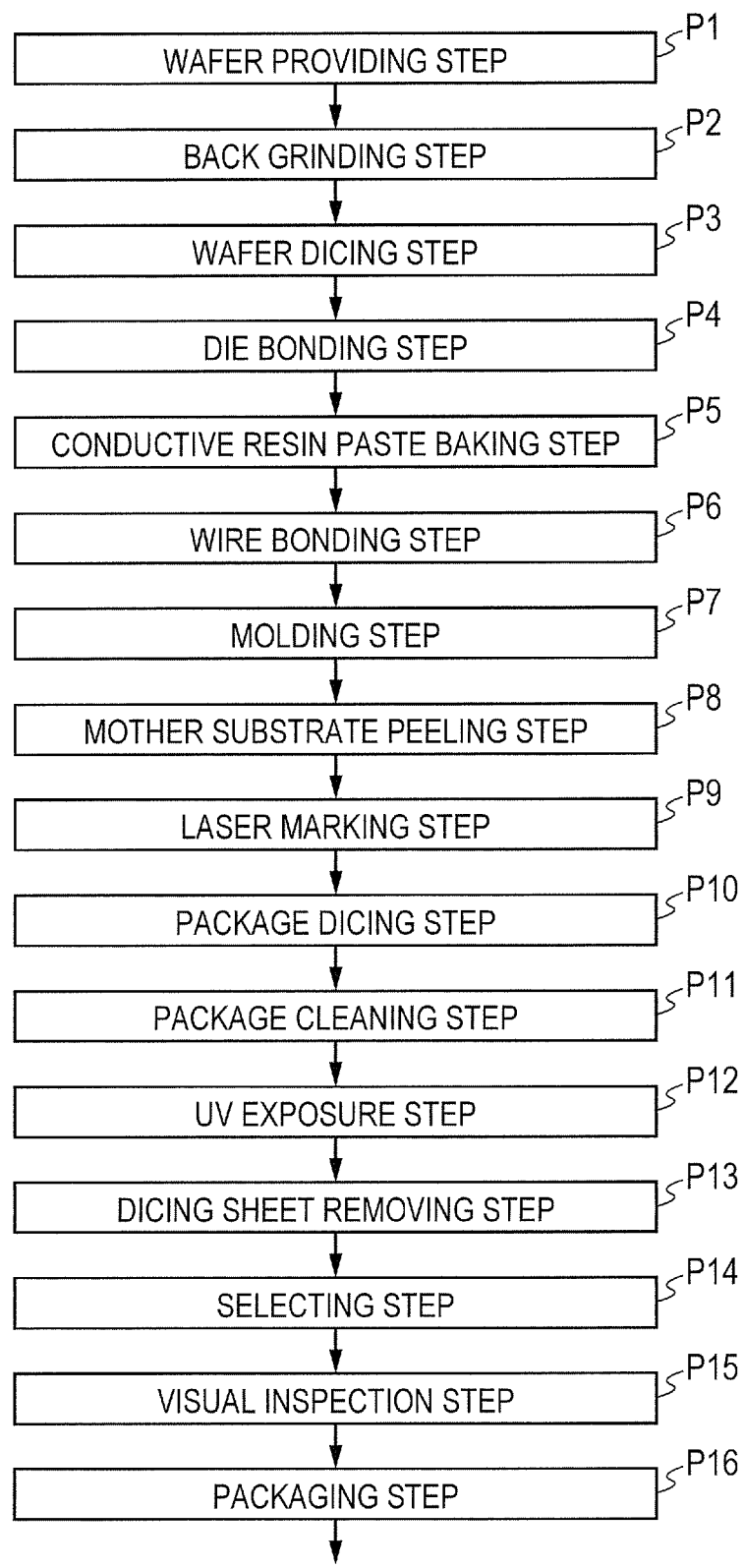
FIG. 27 is a flow chart describing the manufacturing method of the semiconductor device according to First Embodiment of the invention.

FIGS. 8 to 19 are diagrams describing a die bonding step. FIG. 8 is a fragmentary top view of a semiconductor wafer in a wafer providing step; FIG. 9 is a fragmentary top view of a mother substrate; FIG. 10 is an enlarged fragmentary cross-sectional view showing one electrode (external terminal); FIG. 11 is a flow chart describing a manufacturing method of the mother substrate having a plurality of electrodes (external terminals); and FIGS. 12 to 18 are fragmentary cross-sectional views of the mother substrate in each of manufacturing steps of the mother substrate having a plurality of electrodes (external terminals). FIG. 19 is a fragmentary cross-sectional view of the mother substrate in a die bonding step; FIG. 20 is a fragmentary cross-sectional view of the mother substrate in a conductive resin paste baking step; FIG. 21 is a cross-sectional view of the mother substrate in a wire bonding step; FIG. 22 is a fragmentary cross-sectional view of the mother substrate in a molding step; and FIG. 23 is a fragmentary cross-sectional view of the mother substrate in a mother substrate peeling step; FIG. 24 is a fragmentary cross-sectional view of the mother substrate in a laser marking step; FIG. 25 is a fragmentary cross-sectional view of the mother substrate in a package dicing step; and FIG. 26 is a fragmentary cross-sectional view of the mother substrate in a dicing sheet removing step. FIG. 27 is a flow chart for describing the manufacturing method of the semiconductor device.

FIGS. 19 to 26 show fragmentary cross-sectional views of a product region (chip mounting region DIA) corresponding to the cross-section (including two conductive members) taken along the line A-A' of FIG. 2. Accordingly, they include the electrode 3a (semiconductor chip 2a[D1]) and the electrode 3d (semiconductor chip 2d[D4]), but not include the electrode 3b (semiconductor chip 2b[D2]) and the electrode 3c (semiconductor chip 2c[D3]). In addition, they include the conductive members 5a and 5d, but not include the conductive members 5b, 5c, and 5e.

<Wafer Providing Step P1>

First, a semiconductor wafer 16 as shown in FIG. 8 is provided. The semiconductor wafer 16 is made of single crystal silicon and has a diameter of, for example, 200 mm or 300 mm and a thickness (first thickness) of, for example, 0.7 mm or greater (the thickness when the wafer is put in a manufacturing step). The semiconductor wafer 16 has a first main surface (surface), two or more chip regions 17 formed on the first main surface in matrix form, a cutting region (scribe region, dicing region, dicing line) 18 formed between two adjacent chip regions 17, among a plurality of chip regions 17, and a second main surface (back surface) on the side opposite to the first main surface.

The chip regions 17 of the semiconductor wafer 16 each has a diode and the chip regions 17 each has, on the surface thereof, a bonding pad 6. The bonding pad 6 is made of a metal film, for example, aluminum (Al) and is exposed from an opening portion (not illustrated) formed in a surface protecting film (not illustrated) for protecting the diode.

<Back Grinding Step P2>

Next, the second main surface of the semiconductor wafer 16 is thinned to a predetermined thickness (second thickness), for example, a thickness of from 0.1 mm to 0.3 mm by grinding the second main surface of the semiconductor wafer 16 with a grinding material. Then, the semiconductor wafer 16 is washed to remove grinding abrasives and contaminants attached to the semiconductor wafer 16.

<Wafer Dicing Step P3>

The semiconductor wafer 16 is then diced vertically and horizontally along the cutting region 18 by using an ultrathin circular blade (dicing blade) having diamond fine grains attached thereto. The semiconductor wafer 16 is diced into individual semiconductor chips.

<Die Bonding Step P4>

[P4-1: Base Material Providing Step]

Next, as shown in FIG. 9, a mother substrate (substrate, base material, parent material) 19 is provided. The mother substrate 19 is made of a conductive member, for example, stainless (SUS430) or copper (Cu) and it is a multi-chip substrate in which regions (chip mounting regions DIA) in which four semiconductor chips are placed are arranged in matrix form. FIG. 9 shows a mother substrate 19 having three blocks, each block comprised of a plurality of chip mounting regions DIA.

The mother substrate 19 has a thickness of, for example, 0.15 mm.

The mother substrate 19 has, in one of the chip mounting regions DIA on the upper surface (surface, chip mounting surface) thereof, electrodes 3a, 3b, 3c, and 3d, and the electrode 4.

As shown in FIG. 10, the electrodes 3a, 3b, 3c, and 3d and the electrode 4 are each comprised of a film stack obtained by successively stacking a gold (Au) film 3A, a nickel (Ni) film 3B, and a silver (Ag) film 3C or a gold (Au) film one after another in this order, for example, by electroplating and they have a mushroom-like shape with the nickel (Ni) film 3B being canopied. Although the upper surfaces of the electrodes 3a, 3b, 3c, and 3d, and the electrode 4 are at positions higher than the upper surface of the mother substrate 19, the electrodes 3a, 3b, 3c, and 3d, and the electrode 4 can be formed, by electroplating, with a thickness not greater than about half of the thickness of a lead made of a portion of a leadframe formed by patterning a conductive substrate (metal plate). In addition, the metal electrodes 3a, 3b, 3c, and 3d, and the electrode 4 each having a mushroom-like shape can be expected to have an anchor effect of the electrodes 3a, 3b, 3c, and 3d, and the electrode 4 in a molding step p7, that is, a manufacturing step conducted later. The thickness of the gold (Au) film 3A configuring the electrodes 3a, 3b, 3c, and 3d, and the electrode 4 is, for example, 0.1 μm or greater, the nickel (Ni) film 3B is, for example, from 50 to 80 μm, and the silver (Ag) film 3C or gold (Au) film is, for example, 2.5 μm or greater.

Next, one example of a manufacturing method of the mother substrate 19 having thereon the electrodes 3a, 3b, 3c, and 3d, and the electrode 4 will be described referring to FIGS. 11 to 18. FIG. 11 is a flow chart for describing the manufacturing method of the mother substrate 19 having thereon the electrodes 3a, 3b, 3c, and 3d, and the electrode 4; and FIGS. 12 to 18 are fragmentary cross-sectional views of the mother substrate 19 having the electrodes 3a, 3b, 3c, and 3d, and the electrode 4 in each manufacturing step of the mother substrate 19. FIGS. 12 to 18 show fragmentary cross-sectional views corresponding to, for example, the cross-section taken along a line B-B' of the above-described FIG. 9.

P4-1(1): From Resist Applying Step to Exposure Step

Figure 12:
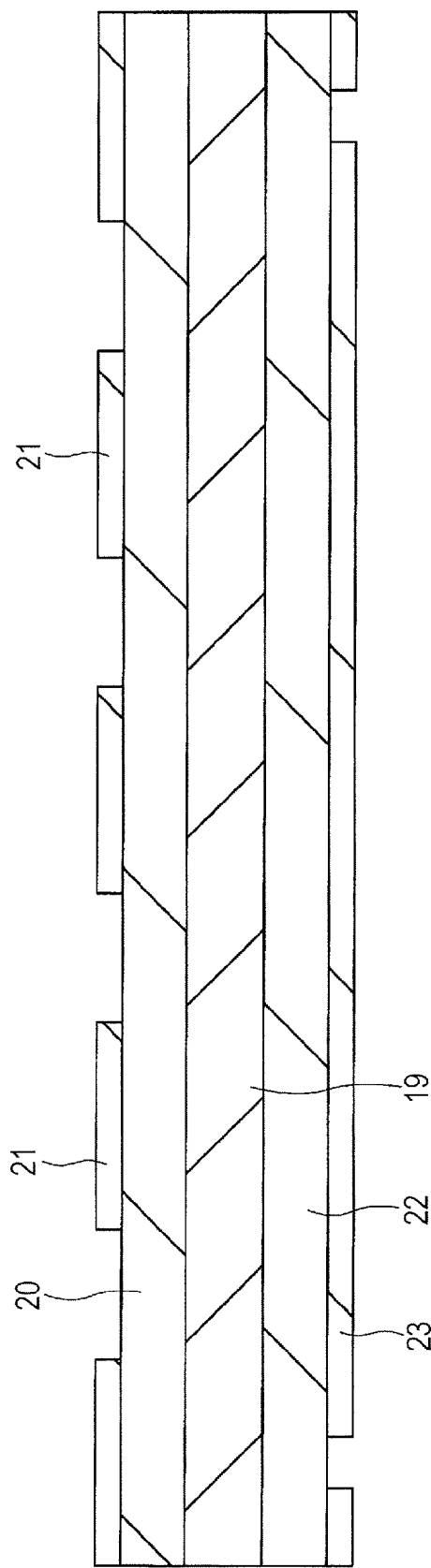
FIG. 12 is a fragmentary cross-sectional view of the mother substrate in a manufacturing step of the mother substrate having a plurality of electrodes (external terminals) according to First Embodiment of the invention.

As shown in FIG. 12, after application of a resist film 20 onto the upper surface of the mother substrate 19, the resist film 20 is exposed to ultraviolet rays via a film mask 21 having a predetermined pattern. Similarly, after application of a resist film 22 onto the lower surface (back surface) on the side opposite to the upper surface of the mother substrate 19, the resist film 22 is exposed to ultraviolet rays via a film mask 23 having a predetermined pattern.

P4-1 (2): Developing Step

Figure 13:
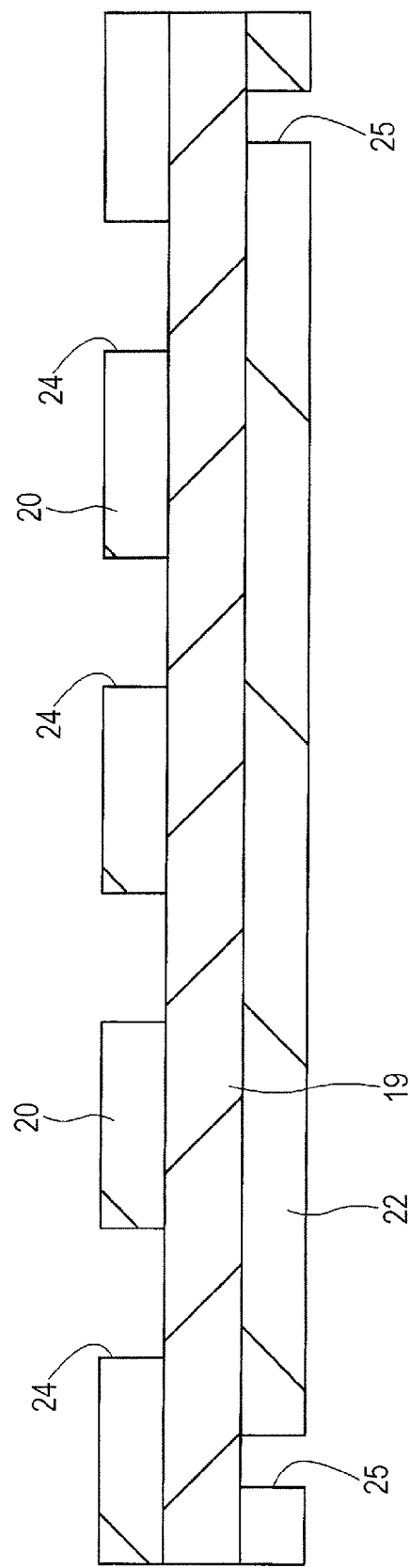
FIG. 13 is a fragmentary cross-sectional view (following FIG. 12, the fragmentary cross-sectional view showing the same portion as that of FIG. 12) of the mother substrate in a manufacturing step of the mother substrate having a plurality of electrodes (external terminals) according to First Embodiment of the invention.

As shown in FIG. 13, after removal of the film masks 21 and 23, developing treatment is given to pattern the resist film 20 applied to the upper surface of the mother substrate 19 and the resist film 22 applied to the lower surface of the mother substrate 19. In the resist film 20 applied onto the upper surface of the mother substrate 19, electrode holes 24 for forming the electrodes 3a, 3b, 3c, and 3d, and the electrode 4 are formed. In addition, a guide hole 25 is formed in the resist film 22 applied onto the lower surface of the mother substrate 19.

P4-1 (3): Gold Plating Step

Figure 14:
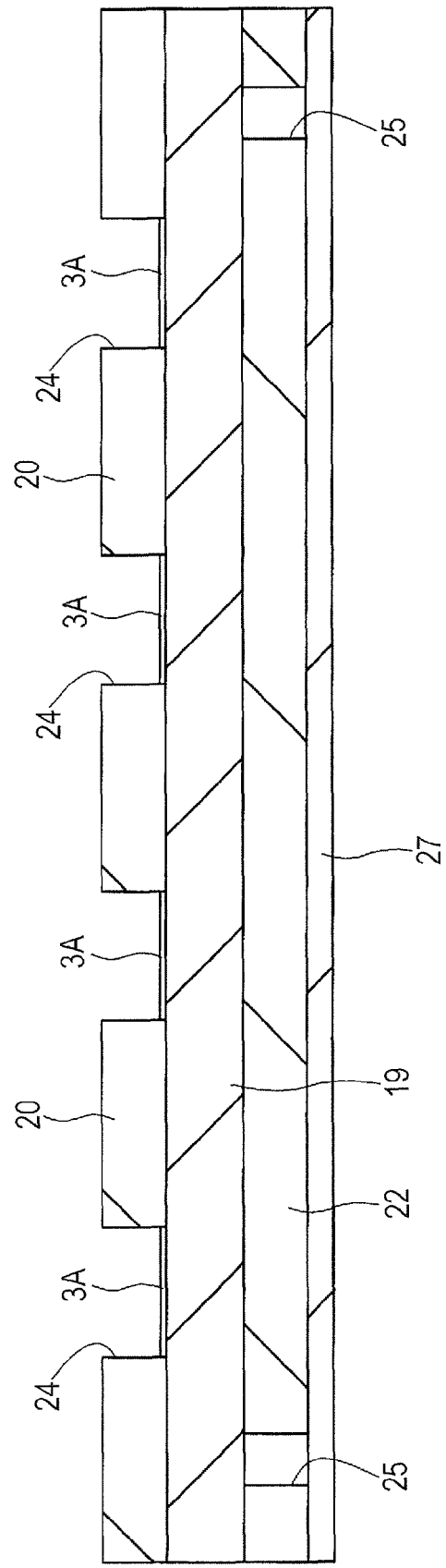
FIG. 14 is a fragmentary cross-sectional view (following FIG. 13, the fragmentary cross-sectional view showing the same portion as that of FIG. 12) of the mother substrate in a manufacturing step of the mother substrate having a plurality of electrodes (external terminals) according to First Embodiment of the invention.

As shown in FIG. 14, after the surface of the resist film 22 formed on the lower surface of the mother substrate 19 is covered with a protecting film 27, a gold (Au) film 3A is formed (deposited) by electroplating on the bottom of the electrode holes 24 formed on the upper surface of the mother substrate 19. The gold (Au) film 3A has a thickness of, for example, 0.1 μm. In order to prevent the gold (Au) film 3A from peeling from the mother substrate 19, a film may be formed, prior to the formation of the gold (Au) film 3A, on the bottoms of the electrode holes 24 formed on the upper surface of the mother substrate 19.

P4-1 (4): Nickel Plating Step

Figure 15:
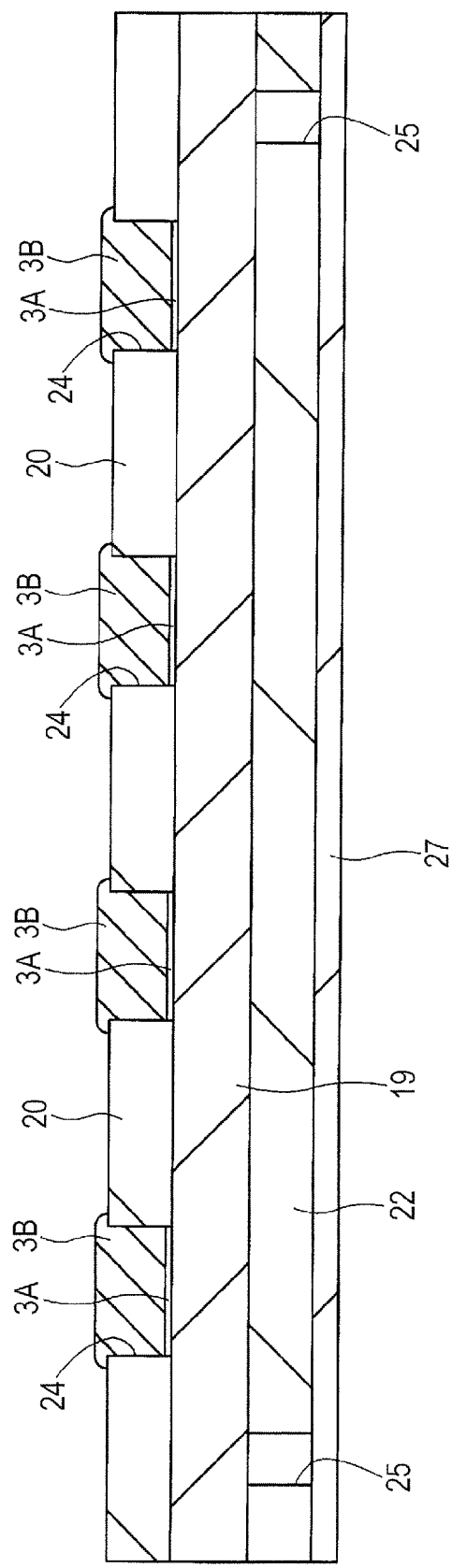
FIG. 15 is a fragmentary cross-sectional view (following FIG. 14, the fragmentary cross-sectional view showing the same portion as that of FIG. 12) of the mother substrate in a manufacturing step of the mother substrate having a plurality of electrodes (external terminals) according to First Embodiment of the invention.

As shown in FIG. 15, a nickel (Ni) film 3B is formed (deposited) by electroplating in the electrode holes 24 formed on the upper surface of the mother substrate 19 so as to be brought into contact with the gold (Au) film 3A. This nickel (Ni) film 3B is formed not only in the electrode holes 24 but it spreads over the surface of the resist film 20 so that it has a mushroom-like shape with an overhang (a canopied site). This nickel (Ni) film 3B has a thickness of, for example, about 60 μm.

P4-1 (5): Silver (or Gold) Plating Step

Figure 16:
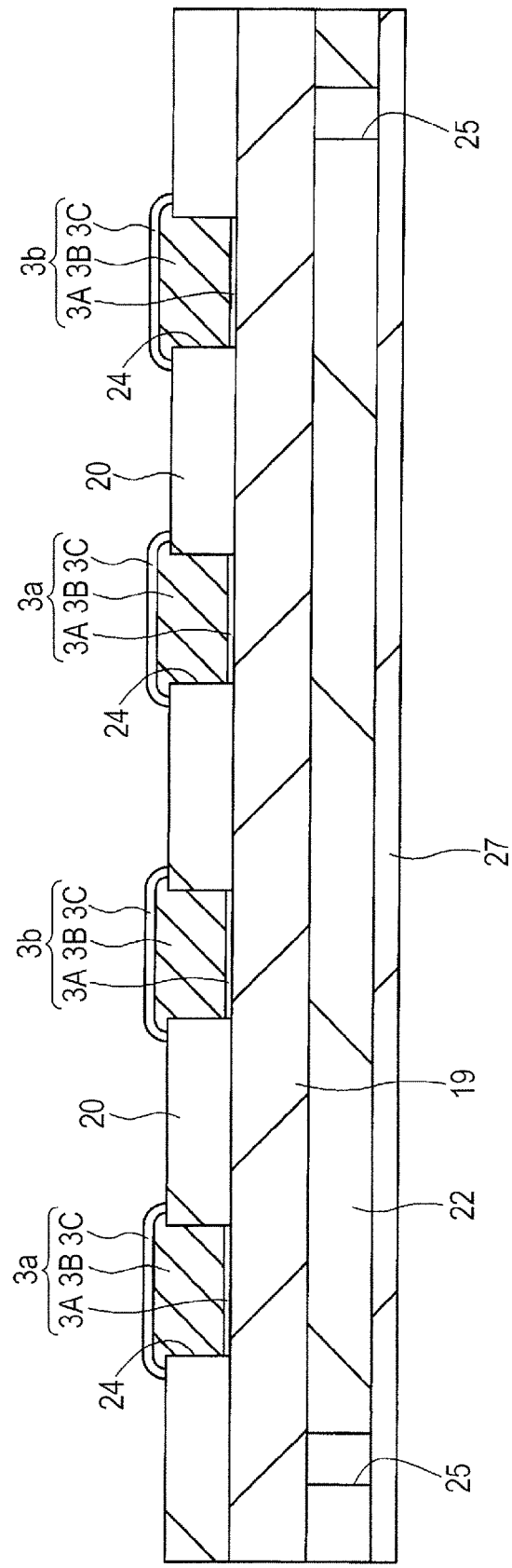
FIG. 16 is a fragmentary cross-sectional view (following FIG. 15, the fragmentary cross-sectional view showing the same portion as that of FIG. 12) of the mother substrate in a manufacturing step of the mother substrate having a plurality of electrodes (external terminals) according to First Embodiment of the invention.

As shown in FIG. 16, a silver (Ag) film (or a gold (Au) film) 3C is formed (deposited) by electroplating in contact with the surface of the nickel (Ni) film 3B formed on the upper surface of the mother substrate 19. The thickness of the silver (Ag) film (or gold (Au) film) 3C is, for example, 3 μm. In this manner, the electrodes 3a, 3b, 3c, and 3d, and the electrode 4 having the gold (Au) film 3A, the nickel (Ni) film 3B, and the silver (Ag) film (or gold (Au) film) 3C stacked one after another are formed (FIGS. 16 to 18 include only the electrodes 3a and 3b).

In the above description on First Embodiment, the gold (Au) film 3A, the nickel (Ni) film 3B, and the silver (Ag) film (or gold (Au) film) 3C are formed by electroplating, but they may be formed by electroless plating. Electroplating is however preferred when the formation rate (deposition rate) of these plated films is taken into consideration.

P4-1 (6): Frame Etching Step

As shown in FIG. 17, after removal of the protecting film 27 which has covered the surface of the resist film 22 formed on the lower surface of the mother substrate 19, the mother substrate 19 is etched with the resist film 22 as a mask, by which an outer frame 28 of the mother substrate 19 corresponding to the guide hole 25 formed in the resist film 22 is formed.

P4-1 (7): Removing Step

As shown in FIG. 18, by removing the resist films 20 and 22 and removing also an extra portion of the mother substrate 19, the mother substrate 19 having the electrodes 3a, 3b, 3c, and 3d, and the electrode 4 is substantially completed.

[P4-2: Die Bonding Step]

Next, as shown in FIG. 19, after the surface of the semiconductor chip 2 is adsorbed and supported by a cylindrical collet 29, the semiconductor chip 2 is released from the dicing tape and picked up. The semiconductor chip 2 thus picked up is transported to the electrode 3a, 3b, 3c, or 3d on the upper surface of the mother substrate 19.

Next, a conductive resin material 7 is added dropwise onto the upper surface of the electrode 3a, 3b, 3c, or 3d. The conductive resin material 7 is, for example, a silver (Ag) pate and it has a viscosity of, for example, from 10 Pa·s to 20 Pa·s (5 rpm). Then, the upper surface of the electrode 3a, 3b, 3c, or 3d and the back surface of the semiconductor chip 2 are faced to each other and the semiconductor chip 2 is placed on the upper surface of the electrode 3a, 3b, 3c, or 3d via the conductive resin material 7. A load is applied to the semiconductor chip 2 to fix the semiconductor chip 2.

<Conductive Resin Paste Baking Step P5>

Next, as shown in FIG. 20, heat treatment is given to the mother substrate 19 having the semiconductor chips 2a[D1], 2b[D2], 2c[D3], and 2d[D4] attached thereto. This heat treatment accelerates the curing reaction of the conductive resin material 7 to enhance the respective adhesion between the semiconductor chips 2a[D1], 2b[D2], 2c[D3], and 2d[D4] and the electrodes 3a, 3b, 3c, and 3d.

<Wire Bonding Step P6>

Next, as shown in FIG. 21, conductive members 5a, 5b, 5c, 5d, and 5e are formed, for example, by nail head bonding (ball bonding) method using ultrasonic vibration and thermocompression bonding in combination. As shown above in FIG. 2, the conductive member 5a electrically couples the bonding pad 6 provided on the surface of the semiconductor chip 2a[D1] and the upper surface of the electrode 4. The conductive member 5b electrically couples the bonding pad 6 provided on the surface of the semiconductor chip 2b[D2] and the exposed upper surface of the electrode 3a (coupling region 8a) to which the back surface of the semiconductor chip 2a[D1] is coupled. The conductive member 5c electrically couples the bonding pad 6 provided on the surface of the semiconductor chip 2c[D3] and the exposed upper surface of the electrode 3d (coupling region 8d) to which the back surface of the semiconductor chip 2d[D4] is coupled. The conductive member 5d electrically couples the bonding pad 6 provided on the surface of the semiconductor chip 2d[D4] and the upper surface of the electrode 4. The conductive member 5e electrically couples the exposed upper surface of the electrode 3b (coupling region 8b) to which the back surface of the semiconductor chip 2b[D2] is coupled and the exposed upper surface of the electrode 3c (coupling region 8c) to which the back surface of the semiconductor chip 2c [D3] is coupled.

As the conductive members 5a, 5b, 5c, 5e, and 5e, for example, a wire (gold (Au) wire) is used. More specifically, the edge of the wire is melted using arc discharge to form a ball by surface tension. By using a capillary (a cylindrical coupling jig), the ball is bonded to the upper surface of the bonding pad 6, the electrodes 3a, 3b, 3c, and 3d, and the electrode 4 by thermocompression bonding while applying ultrasonic vibration of, for example, 120 kHz.

A forward bonding process (a process of coupling the bonding pad 6 of the semiconductor chips 2a[D1], 2b[D2], 2c[D3], and 2d[D4] to a portion of the wire, followed by coupling the upper surface of the electrodes 3a, 3b, 3c, and 3d and the electrode 4 to the other portion of the wire) is mainly used, but a reverse bonding process (a process of coupling the upper surface of the electrodes 3a, 3b, 3c, and 3d and the electrode 4 to a portion of the wire, followed by coupling the bonding pad 6 of the semiconductor chips 2a[D1], 2b[D2], 2c[D3], and 2d[D4] to the other portion of the wire) may be used instead.

<Molding Step P7>

Next, as shown in FIG. 22, one resin molding (molding) 9 is formed by setting the mother substrate 19 having thereon the semiconductor chips 2a[D1], 2b[D2], 2c[D3], and 2d[D4] in a metal molding machine, pouring a sealing resin which has been liquefied by heating into the metal molding machine while applying a pressure, and encapsulating the upper surface side of the mother substrate 19 with a sealing resin. Then, heat treatment (post cure baking) is conducted, for example, at 175° C. for 5 hours, by which portions (upper surface and side surface) of the semiconductor chips 2a[D1], 2b[D2], 2c[D3], and 2d[D4], a portion (side surface) of the electrodes 3a, 3b, 3c, and 3d, portions (upper surface and side surface) of the electrode 4, and the conductive members 5a, 5b, 5c, 5d, and 5e are sealed with the resin molding 9 which covers the upper surface side of the mother substrate 19. The resin molding 9 has a thickness of, for example, 0.4 mm. The resin molding 9 is made of an epoxy-based thermosetting insulating resin containing, for example, a phenolic curing agent, a silicone rubber, and many fillers (for example, silica) in order to reduce the stress.

<Mother Substrate Peeling Step P8>

Next, as shown in FIG. 23, the mother substrate 19 is peeled from the resin molding 7 while folding it. As a result, the other portion (lower surface) of each of the electrodes 3a, 3b, 3c, and 3d and the electrode 4 is exposed from the lower surface of the resin molding 9.

<Laser Marking Step P9>

Next, as shown in FIG. 24, a product name and the like are marked on the upper surface of the resin molding 7 by using laser 30.

<Package Dicing Step P10>

Next, as shown in FIG. 25, a dicing sheet 31 is provided. The dicing sheet 31 has, on the upper surface thereof, an adhesive layer 32. The adhesive layer 32 is, for example, an acrylic UV-curing type pressure-sensitive adhesive. Next, the resin molding 9 covering therewith portions (upper surface and side surface) of the semiconductor chips 2a[D1], 2b[D2], 2c[D3], and 2d[D4], a portion (side surface) of the electrodes 3a, 3b, 3c, and 3d, portions (upper surface and side surface) of the electrode 4, and the conductive members 5a, 5b, 5c, 5d, and 5e is fixed to the upper surface of the dicing sheet 31 with the adhesive layer 32.

Next, by using, for example, an ultrathin circular blade (dicing blade) attached with diamond abrasive grains, the resin molding 9 is diced vertically and horizontally from the lower surface side of the resin molding 9 along a scribe region. At the same time, the adhesive layer 32 is also diced vertically and horizontally along the scribe region. The resin molding 9 is diced into individual semiconductor devices 1, but even after individualization, the semiconductor devices 1 are kept aligned because they are fixed by the dicing sheet 31.

<Package Cleaning Step P11>

Next, the semiconductor device 1 is cleaned to remove dusts generated during the dicing of the resin molding 9 and the adhesive layer 32.

<UV Exposure Step P12>

Next, the dicing sheet 31 is exposed to ultraviolet rays from the lower surface side of the sheet to reduce the adhesion of the adhesive layer 32. This facilitates peeling of each of the semiconductor devices 1 from the dicing sheet 31. This dicing sheet 31 is made of an UV-permeable material so that it permits permeation of ultraviolet rays.

<Dicing Sheet Removing Step P13>

Next, as shown in FIG. 26, the dicing sheet 31 is removed to obtain individual semiconductor devices 1. From the lower surface of the resin molding 9 of the semiconductor device 1, the lower surfaces of the electrodes 3a, 3b, 3c, and 3d and the electrode 4 are exposed.

<Selecting Step P14 and Visual Inspection Step P15>

Next, from the semiconductor devices thus obtained, those conforming to the product standards are selected and after final visual inspection, finished products (semiconductor devices 1) are obtained.

<Packaging Step P16>

Next, the products (semiconductor devices 1) are housed in recesses formed in advance in a carrier tape. Then, the carrier tape is, for example, wound around a reel. The reel is put in a moistureproof bag and shipped with the semiconductor devices therein.

Thus, according to First Embodiment, the four semiconductor chips 2a[D1], 2b[D2], 2c[D3], and 2d[D4] can be integrated in one semiconductor package by employing the electrodes 3a, 3b, 3c, and 3d, and the electrode 4 formed by electroplating. This makes it possible to realize the semiconductor device 1 configuring a diode bridge circuit which is smaller and thinner than the semiconductor device 51 using four independent diodes 52 shown above in FIG. 30.

Example 2

Semiconductor Device

Figure 28:
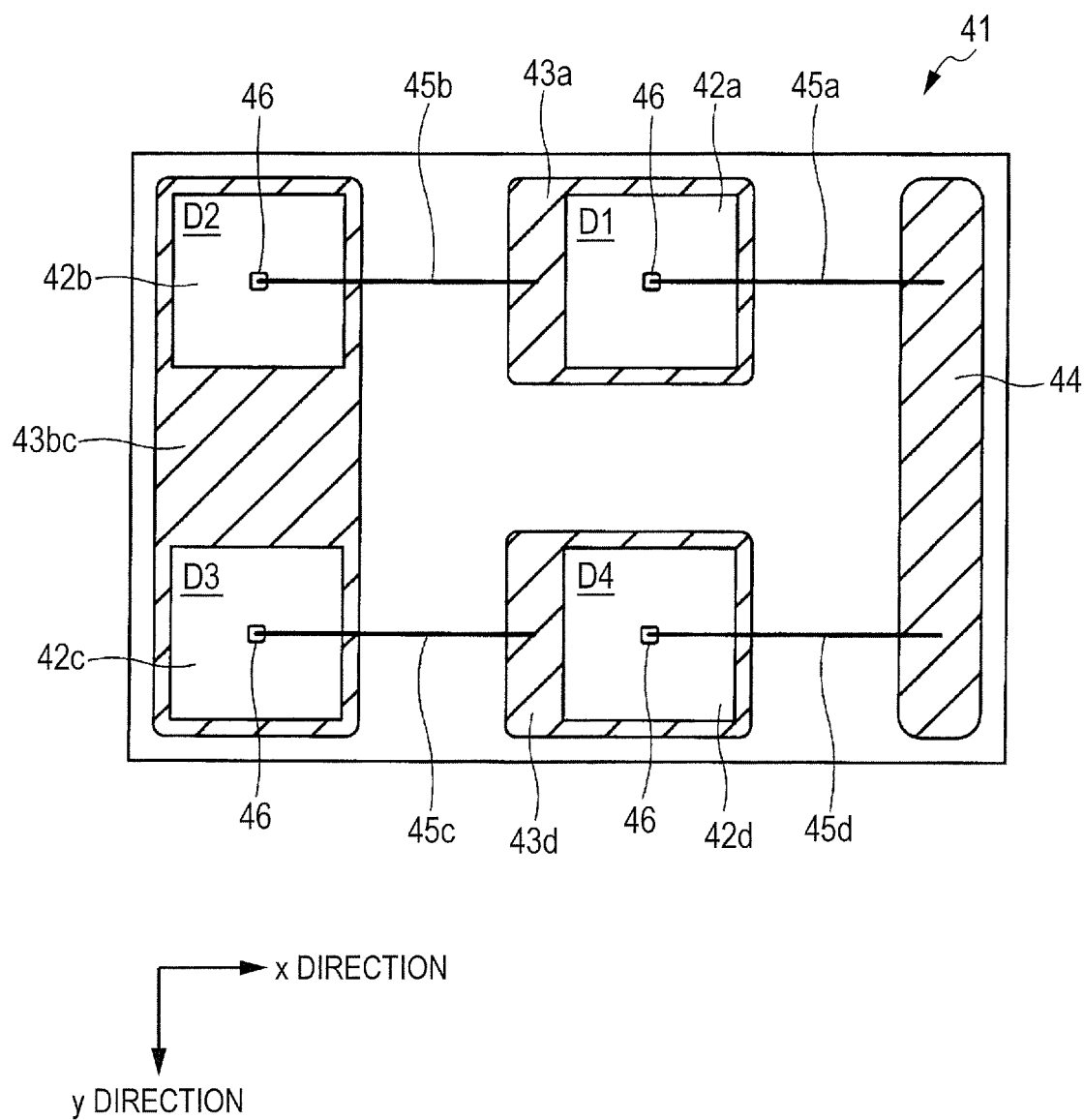
FIG. 28 is a fragmentary plan view through which the surface side of a semiconductor device according to Second Embodiment of the invention is seen.

The structure of a semiconductor device configuring a diode bridge circuit according to Second Embodiment will next be described referring to FIG. 28. FIG. 28 is a fragmentary plan view through which a resin molding on the surface side of the semiconductor device is seen.

The semiconductor device according to Second Embodiment is similar to the semiconductor device 1 according to above-mentioned First Embodiment and four semiconductor chips are integrated in one semiconductor package by using an electrode formed by electroplating. The semiconductor device according to Second Embodiment is however different from that according to First Embodiment in the arrangement of electrodes.

Described specifically, in the above-mentioned First Embodiment, the electrode 3a corresponding to the first input terminal A and the electrode 3b corresponding to the second output terminal D are spaced apart in the x direction; the electrode 3d corresponding to the second input terminal B and the electrode 3c corresponding to the second output terminal D are spaced apart in the x direction; and the electrode 4 corresponding to the first output terminal C is formed in a portion of the third region AR3 between the first region AR1 in which the electrode 3a and the electrode 3b are placed and the second region AR2 in which the electrode 3d and the electrode 3c are placed.

In a semiconductor device 41 according to Second Embodiment, as shown in FIG. 28, an electrode (electrode plate (fifth electrode)) 44 corresponding to the first output terminal C is formed outside the region in which an electrode (electrode plate, die island (first electrode)) 43a corresponding to the first input terminal A, an electrode (electrode plate, die island (fourth electrode)) 43d corresponding to the second input terminal B, and an electrode (electrode plate, die island (second electrode and third electrode)) 43bc corresponding to the second output terminal D.

In other words, the electrode 44 corresponding to the first output terminal C is spaced apart from the electrode 43bc corresponding to the second output terminal D in the x direction (first direction) with a predetermined distance. The electrode 43a and the electrode 43d are spaced apart in the y direction (second direction) and formed between the electrode 43bc and the electrode 44 with a predetermined distance from the electrode 43bc and the electrode 44.

Moreover, a semiconductor chip (first semiconductor chip) 42a[D1] is bonded onto the upper surface of the electrode 43a via a conductive resin material (not illustrated) and a semiconductor chip (fourth semiconductor chip) 42d[D4] is bonded onto the upper surface of the electrode 43d via a conductive resin material (not illustrated). In addition, a semiconductor chip (second semiconductor chip) 42b[D2] and a semiconductor chip (third semiconductor chip) 42c[D3] are spaced apart from each other and bonded onto the upper surface of the electrode 43bc via a conductive resin material (not illustrated) along the y direction. The semiconductor chip 42b[D2] and the semiconductor chip 42a[D1] are placed along the x direction, while the semiconductor chip 42c[D3] and the semiconductor chip 42d[D4] are placed along the x direction.

The electrodes 43a, 43bc, and 43d, and the electrode 44 and the semiconductor chips 42a[D1], 42b[D2], 42c[D3], and 42d[D4] are electrically coupled in the following manner by using conductive members 45a, 45b, 45c, and 45d.

Described specifically, a bonding pad (electrode pad, surface electrode) 46 provided on the surface of the semiconductor chip 42a[D1] and the upper surface of a first portion of the electrode 44 are coupled to each other via a conductive member (first conductive member) 45a; and a bonding pad 46 provided on the surface of the semiconductor chip 42d[D4] and the upper surface of a second portion of the electrode 44 are coupled to each other via a conductive member (fourth conductive member) 45d. A bonding pad 46 provided on the surface of the semiconductor chip 42d[D2] and the exposed upper surface of the electrode 43a to which the back surface of the semiconductor chip 42a[D1] is coupled are coupled to each other via a conductive member (second conductive member) 45b. Further, a bonding pad 46 provided on the surface of the semiconductor chip 42c[D3] and the exposed upper surface of the electrode 43d to which the back surface of the semiconductor chip 42d[D4] is coupled are coupled to each other via a conductive member (third conductive member) 45c.

Since the conductive member 45a, 45b, 45c, and 45d are all formed along the x direction, these conductive member 45a, 45b, 45c, and 45d can be formed easily and problems such as contact among the conductive members 45a, 45b, 45c, and 45d do not occur. In addition, both the back surface of the semiconductor chip 42b[D2] and the back surface of the semiconductor chip 42c[D3] are coupled to the electrode 43bc, the conductive member 5e used in the above-mentioned First Embodiment for electrically coupling the electrode 3b and the electrode 3c is not necessary.

Thus, Second Embodiment makes it easier to form the conductive members 45a, 45b, 45c, and 45d compared with the First Embodiment described above and problems such as contact do not occur so that the semiconductor device 41 has improved reliability.

<Modification Example of Semiconductor Device>

Arrangement of the electrodes corresponding to the first input terminal A, the second input terminal B, the first output terminal C, and the second output terminal D in the semiconductor device 41 according to Second Embodiment is not limited to the above-mentioned arrangement shown in FIG. 28.

Figure 29:
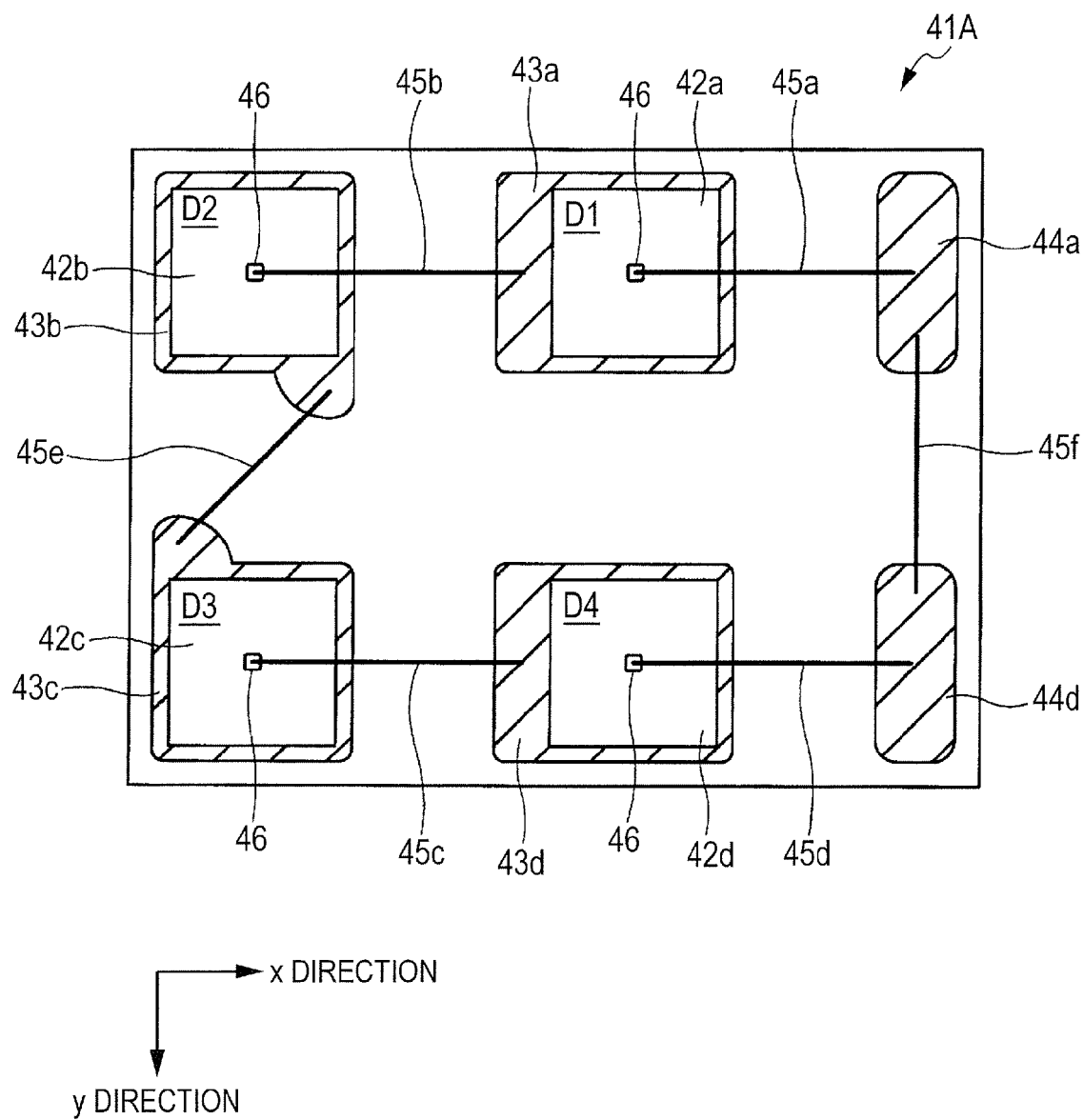
FIG. 29 is a fragmentary plan view through which a resin molding on the surface side of a modification example of the semiconductor device according to Second Embodiment of the invention is seen.

A modification example of the arrangement of the electrodes in Second Embodiment will next be described referring to FIG. 29. FIG. 29 is a fragmentary plan view through which a resin molding on the surface side of the semiconductor device is seen.

As shown in FIG. 29, in the above-mentioned semiconductor device 41, the electrode corresponding to the first output terminal C is comprised of one electrode 44, while in the semiconductor device 41A of the modification example, the electrode corresponding to the first output terminal C is comprised of an electrode (first portion) 44a and an electrode (second portion) 44b. The electrode 44a and the electrode 44d have the same potential and they are spaced apart from each other in the y direction. In the above-mentioned semiconductor device 41, the electrode corresponding to the second output terminal D is comprised of one electrode 43bc, while in the semiconductor device 41A of the modification example, the electrode corresponding to the second output terminal D is comprised of an electrode (second electrode) 43b and an electrode (third electrode) 43c. The electrode 43b and the electrode 43c have the same potential and they are spaced apart from each other along the y direction.

Compared with the above-mentioned semiconductor device 41, this modification example needs a conductive member (fifth conductive member) 45e for electrically coupling the electrode 43b and the electrode 43c and a conductive member (sixth conductive member) 45f for electrically coupling the electrode 44a and the electrode 44d. Due to improvement in the freedom of the size and arrangement of the electrodes 43a, 43b, 43c, and 43d, and the electrodes 44a and 44d, however, it is possible to realize the semiconductor device 41A having an arrangement of the electrodes 43a, 43b, 43c, and 43d, and the electrodes 44a and 44b suited for the wiring layout of a wiring base material on which the semiconductor device 41A is mounted.

The invention made by the present inventors has so far been described in detail based on embodiments. It should however be borne in mind that the invention is not limited to or by them. Needless to say, it can be modified without departing from the scope of the invention.

For example, in the above-mentioned embodiments, the invention is applied to a semiconductor device configuring a full-wave rectifier circuit by using four diodes. It can also be applied to a semiconductor device configuring a two-phase half wave rectifier circuit by using two diodes, a three-phase half wave rectifier circuit by using three diodes, or a three-phase full wave rectifier circuit by using six diodes.

The invention can be applied to a semiconductor device configuring a diode bridge circuit.

What is claimed is:

1. A semiconductor device sealed with a resin molding, comprising:
a first electrode;
a second electrode spaced apart from the first electrode and arranged in a first direction;
a fourth electrode spaced apart from the first electrode and arranged in a second direction orthogonal to the first direction;
a third electrode spaced apart from the fourth electrode and arranged in the first direction;
a fifth electrode spaced apart from each of the first electrode, the second electrode, the third electrode, and the fourth electrode and placed in a portion of a third region between a first region in which the first electrode and the second electrode are placed and a second region in which the third electrode and the fourth electrode is placed;
a first semiconductor chip bonded onto an upper surface of the first electrode via a first conductive resin;
a second semiconductor chip bonded onto an upper surface of the second electrode via a second conductive resin;
a third semiconductor chip bonded onto an upper surface of the third electrode via a third conductive resin;
a fourth semiconductor chip bonded onto an upper surface of the fourth electrode via a fourth conductive resin;
a first conductive member having one end coupled to a front surface of the first semiconductor chip and another end coupled to an upper surface of the fifth electrode;
a second conductive member having one end coupled to a front surface of the second semiconductor chip and another end coupled to an exposed portion of the upper surface of the first electrode;
a third conductive member having one end coupled to a front surface of the third semiconductor chip and another end coupled to an exposed portion of the upper surface of the fourth electrode; and
a fourth conductive member having one end coupled to a front surface of the fourth semiconductor chip and another end coupled to the upper surface of the fifth electrode,
wherein a respective lower surface of each of the first electrode, the second electrode, the third electrode, the fourth electrode, and the fifth electrode is exposed from a lower surface of the resin molding, and
wherein the second electrode and the third electrode are electrically coupled to each other.

2. The semiconductor device according to claim 1, further comprising a fifth conductive member having one end coupled to an exposed portion of the upper surface of the second electrode and another end coupled to an exposed portion of the upper surface of the third electrode.

3. The semiconductor device according to claim 2,
wherein the fifth conductive member strides from the second electrode over the fifth electrode to the third electrode, and a space between the fifth conductive member and the fifth electrode is sealed with the resin molding.

4. The semiconductor device according to claim 1,
wherein the second electrode and the third electrode are integrated with each other by using the same conductive member.

5. The semiconductor device according to claim 1,
wherein when viewed from the top, relative to a first virtual center line bisecting between the first electrode and the fourth electrode, the first electrode and the fourth electrode are placed symmetrically and the second electrode and the third electrode are placed symmetrically.

6. The semiconductor device according to claim 1,
wherein a shortest distance between the first electrode and the second electrode, a shortest distance between the third electrode and the fourth electrode, and respective shortest distances between the fifth electrode and each of the first electrode, the second electrode, the third electrode, and the fourth electrode are all equal to each other.

7. The semiconductor device according to claim 1,
wherein a shortest distance between the first electrode and the second electrode, a shortest distance between the third electrode and the fourth electrode, and respective shortest distances between the fifth electrode and each of the first electrode, the second electrode, the third electrode, and the fourth electrode are all greater than a limiting distance of breakdown voltage in air.

8. The semiconductor device according to claim 1,
wherein a linear distance from the one end of the first conductive member to the other end of the first conductive member when viewed from the top and a linear distance from the one end of the fourth conductive member to the other end of the fourth conductive member when viewed from the top are both greater than a limiting distance of breakdown voltage of the resin molding.

9. The semiconductor device according to claim 1,
wherein the first electrode, the second electrode, the third electrode, the fourth electrode, and the fifth electrode are each comprised of a conductive member formed by plating.

10. The semiconductor device according to claim 1,
wherein the semiconductor device has a thickness of from 0.36 mm to 0.40 mm.

11. The semiconductor device according to claim 1,
wherein the semiconductor device has an area of from 10 mm$^2$ to 11 mm$^2$ when viewed from the top.

12. The semiconductor device according to claim 1,
wherein the first electrode, the second electrode, the third electrode, and the fourth electrode are each quadrangular when viewed from the top, and
wherein the first electrode, the second electrode, the third electrode, and the fourth electrode each have, at a corner portion thereof, a curvature portion.

13. The semiconductor device according to claim 1,
wherein the first electrode, the second electrode, the third electrode, and the fourth electrode each have a first shape portion and a second shape portion when viewed from the top,
wherein the first shape portion is quadrangular and has a curvature portion at a corner portion of the quadrangle, and
wherein the second shape portion has a curve protruded outward from a portion of one side of the quadrangle.

14. The semiconductor device according to claim 13,
wherein when viewed from the top, relative to a second virtual center line bisecting between the first electrode and the second electrode, the first electrode and the second electrode are placed so that the second shape portion of the first electrode and the second shape portion of the second electrode diagonally face each other, and the third electrode and the fourth electrode are placed so that the second shape portion of the third electrode and the second shape portion of the fourth electrode diagonally face each other.

15. The semiconductor device according to claim 1,
wherein the first electrode is a first input terminal of alternating current voltage,
wherein the fourth electrode is a second input terminal of alternating current voltage,
wherein the fifth electrode is a first output terminal of a positive direct current, and
wherein the second electrode and the third electrode have the same potential and at the same time, are second output terminals of a negative direct current.

16. The semiconductor device according to claim 15,
wherein the second output terminal is a ground (GND) terminal.

17. The semiconductor device according to claim 15,
wherein the first semiconductor chip, the second semiconductor chip, the third semiconductor chip, and the fourth semiconductor chip are each a diode,
wherein the front surface of each of the first semiconductor chip, the second semiconductor chip, the third semiconductor chip, and the fourth semiconductor chip is a cathode,
wherein a back surface of each of the first semiconductor chip, the second semiconductor chip, the third semiconductor chip, and the fourth semiconductor chip is an anode, and
wherein the first semiconductor chip, the second semiconductor chip, the third semiconductor chip, and the fourth semiconductor chip configure a diode bridge.

18. The semiconductor device according to claim 15,
wherein the first output terminal is coupled to one end of an external load and the second output terminal is coupled to another end of the external load,
wherein the external load and a smoothing circuit are coupled in parallel to each other, and
wherein the first output terminal is coupled to one end of the smoothing circuit and the second output terminal is coupled to another end of the smoothing circuit.

19. A semiconductor device sealed with a resin molding, comprising:
a second electrode;
a first portion of a fifth electrode spaced apart from the second electrode and arranged in a first direction;
a third electrode spaced apart from the second electrode and arranged in a second direction orthogonal to the first direction;
a second portion of the fifth electrode spaced apart from the third electrode and arranged in the first direction;
a first electrode placed between the second electrode and the first portion of the fifth electrode and spaced apart from the second electrode and the first portion of the fifth electrode;
a fourth electrode placed between the third electrode and the second portion of the fifth electrode and spaced apart from the third electrode and the second portion of the fifth electrode;
a first semiconductor chip bonded onto an upper surface of the first electrode via a first conductive resin;
a second semiconductor chip bonded onto an upper surface of the second electrode via a second conductive resin;
a third semiconductor chip bonded onto an upper surface of the third electrode via a third conductive resin;
a fourth semiconductor chip bonded onto an upper surface of the fourth electrode via a fourth conductive resin;
a first conductive member having one end coupled to a surface of the first semiconductor chip and another end coupled to an upper surface of the first portion of the fifth electrode;
a second conductive member having one end coupled to a surface of the second semiconductor chip and another end coupled to an exposed portion of the upper surface of the first electrode;
a third conductive member having one end coupled to a surface of the third semiconductor chip and another end coupled to an exposed portion of the upper surface of the fourth electrode; and
a fourth conductive member having one end coupled to a surface of the fourth semiconductor chip and another end coupled to an upper surface of the second portion of the fifth electrode,
wherein a lower surface of each of the first electrode, the second electrode, the third electrode, the fourth electrode, the first portion of the fifth electrode, and the second portion of the fifth electrode is exposed from a lower surface of the resin molding,
wherein the second electrode and the third electrode are electrically coupled to each other, and wherein the first portion of the fifth electrode and the second portion of the fifth electrode are electrically coupled to each other.

20. The semiconductor device according to claim 19, further comprising a fifth conductive member having one end coupled to an exposed portion of the upper surface of the second electrode and another end coupled to an exposed portion of the upper surface of the third electrode.

21. The semiconductor device according to claim 19, wherein the second electrode and the third electrode are integrated with each other by using the same conductive member.

22. The semiconductor device according to claim 19, further comprising a sixth conductive member having one end coupled to an upper surface of the first portion of the fifth electrode and another end coupled to the upper surface of the second portion of the fifth electrode.

23. The semiconductor device according to claim 19, wherein the first portion of the fifth electrode and the second portion of the fifth electrode are integrated with each other by using the same conductive member.

* * * * *